(12) United States Patent
Fujita et al.

(10) Patent No.: US 7,336,525 B2
(45) Date of Patent: Feb. 26, 2008

(54) NONVOLATILE MEMORY FOR LOGIC CIRCUITS

(75) Inventors: Shinobu Fujita, Kawasaki (JP); Thomas H. Lee, Burlingame, CA (US)

(73) Assignees: Kabushiki Kaisha Toshiba, Tokyo (JP); Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/061,951

(22) Filed: Feb. 17, 2005

(65) Prior Publication Data

US 2006/0083047 A1    Apr. 20, 2006

Related U.S. Application Data

(60) Provisional application No. 60/620,236, filed on Oct. 18, 2004.

(51) Int. Cl.
*G11C 11/00* (2006.01)
(52) U.S. Cl. ............. 365/154; 365/148; 365/185.08; 365/189.05
(58) Field of Classification Search ............... 365/154, 365/148, 185.08, 189.05
See application file for complete search history.

(56) References Cited

U.S. PATENT DOCUMENTS 6,542,000 B1* 4/2003 Black et al. ................. 326/39
7,082,053 B1* 7/2006 Jenne et al. ................. 365/173
2004/0008539 A1* 1/2004 Pascucci ................. 365/185.07
2004/0125643 A1* 7/2004 Kang et al. ................. 365/148
2005/0207223 A1* 9/2005 Taheri et al. ........... 365/185.08

OTHER PUBLICATIONS

Fujimori, Yoshikazu et al., "Development of Nonvolatile Logic with Ferroelectric Capacitors," *IEICE*, pp. 13-18 (Abstract only).
Liu et al., "Current-Induced Magnetization Switching in Magnetic Tunnel Junctions," Appl. Phys. Lett. vol. 82, No. 17, p. 2871-73 (Apr. 28, 2003).
Ma et al., "Organic Electrical Bistable Devices and Rewritable memory Cells," Appl. Phys. Lett. vol. 80, No. 16, p. 2997-99 (Apr. 22, 2002).
Watanabe et al., "Current-Driven Insulator-Conductor Transition and Nonvolatile memory in Chromium-Doped SrTiO3 Single Crystals," Appl. Phys. Lett., vol. 78, No. 23, p. 3738-40 (Jun. 4, 2001).

* cited by examiner

*Primary Examiner*—Anh Phung
*Assistant Examiner*—Toan Le
(74) *Attorney, Agent, or Firm*—Finnegan, Henderson, Farabow, Garrett & Dunner, L.L.P.

(57) ABSTRACT

A memory circuit that retains stored data upon power down includes a volatile data storage circuit; and at least one nonvolatile memory coupled within the volatile data storage circuit, wherein the at least one nonvolatile memory includes a high resistive state and a low resistive state. The volatile data storage circuit can include cross-coupled inverters, cross-coupled NAND gates, or another volatile data storage circuit. The nonvolatile memories can include a spin-injection magnetic tunnel junction memory, a magnetic tunnel junction memory, a metal insulator phase change memory, an organic memory, or some other memory with two resistive states.

46 Claims, 26 Drawing Sheets

| S | R | Q | $\overline{Q}$ |
|---|---|---|---|
| 0 | 0 | 1 | 1 |
| 1 | 0 | 0 | 1 |
| 0 | 1 | 1 | 0 |
| 1 | 1 | Q | $\overline{Q}$ |

WRITE

FIG. 6A
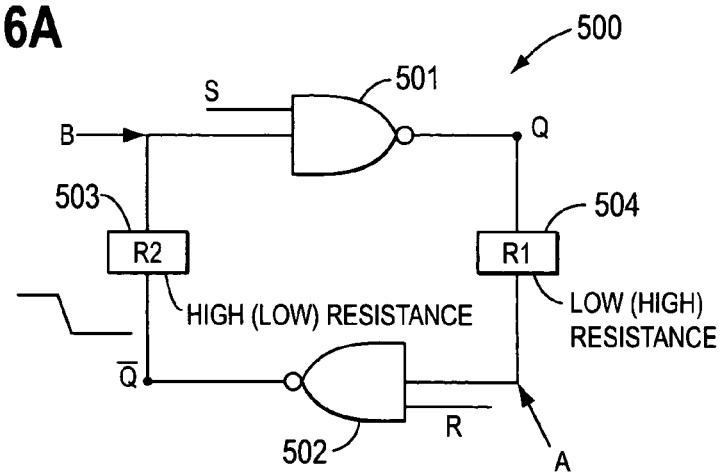
FIG. 6B
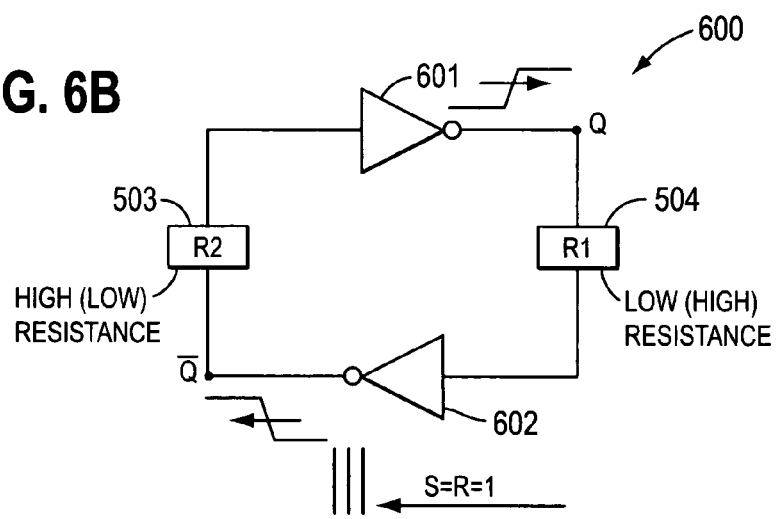
| S | R | Q | $\overline{Q}$ |
|---|---|---|---|
| 0 | 0 | 1 | 1 |
| 1 | 0 | 0 | 1 |
| 0 | 1 | 1 | 0 |
| READ  1 | 1 | Q | $\overline{Q}$ |
FIG. 6C

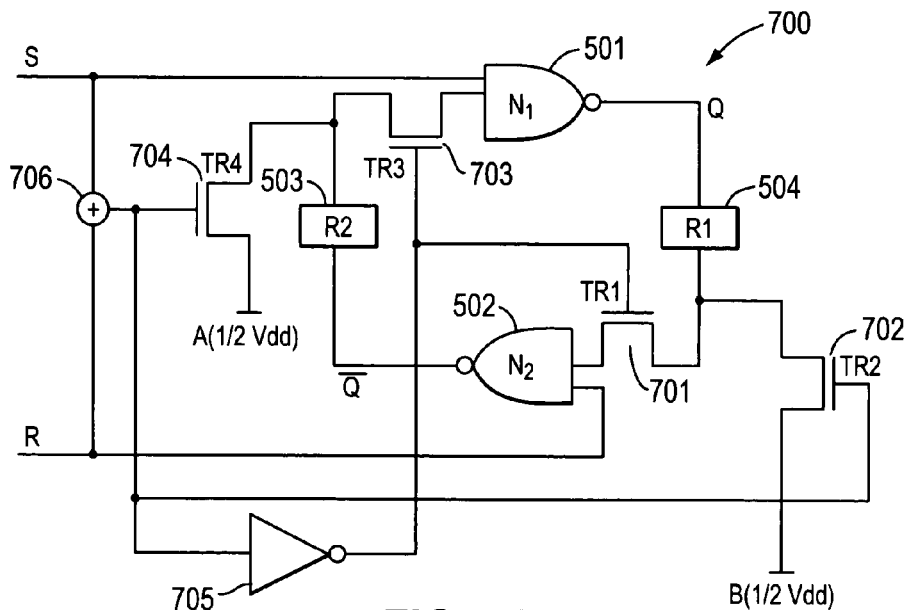
FIG. 7A
FIG. 7B
| S | R | Q | $\overline{Q}$ |
|---|---|---|---|
| 0 | 0 | 1 | 1 |
| 1 | 0 | 0 | 1 |
| 0 | 1 | 1 | 0 |
| 1 | 1 | Q | $\overline{Q}$ |
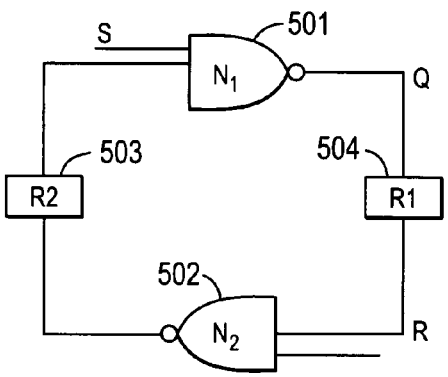
FIG. 7C
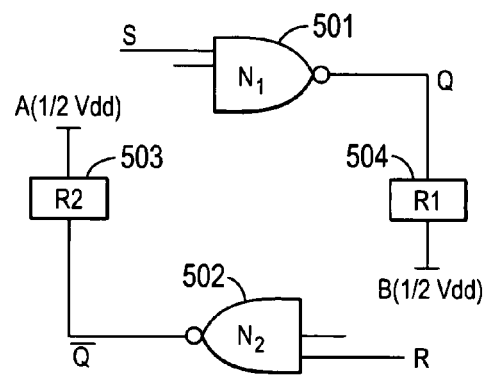
FIG. 7D

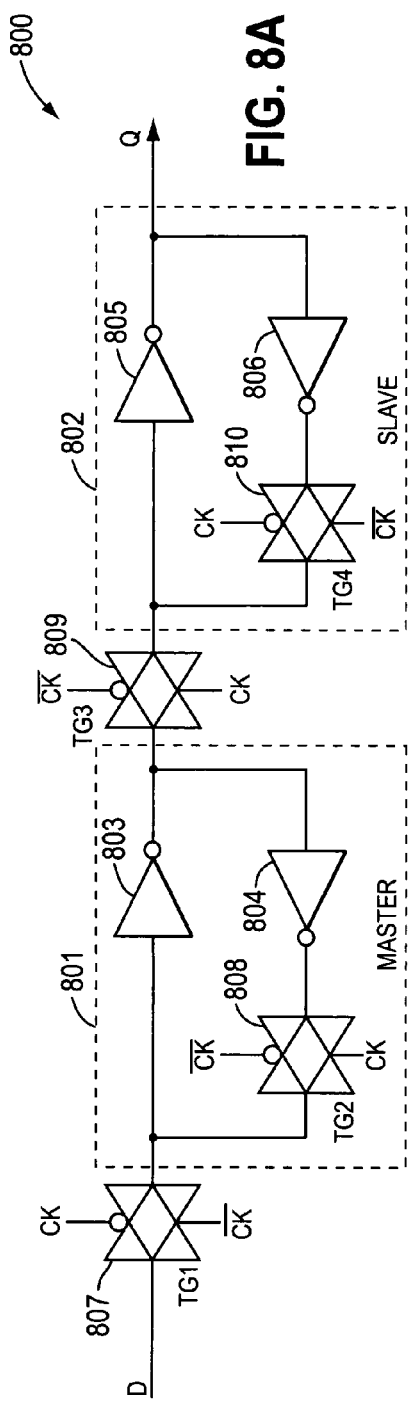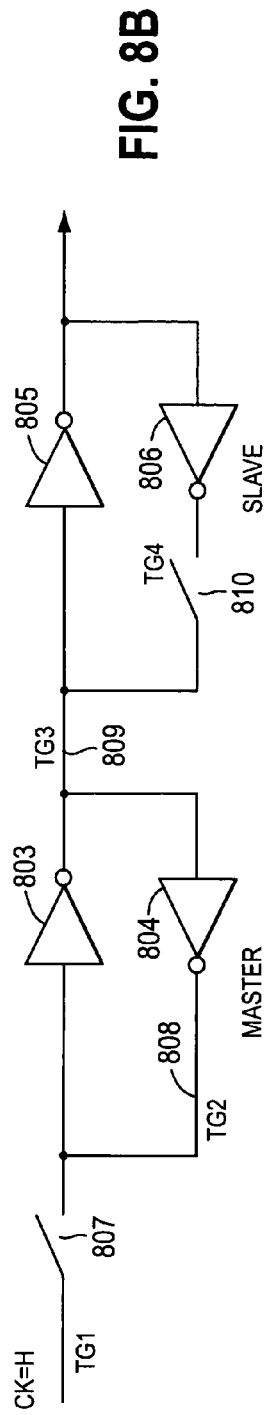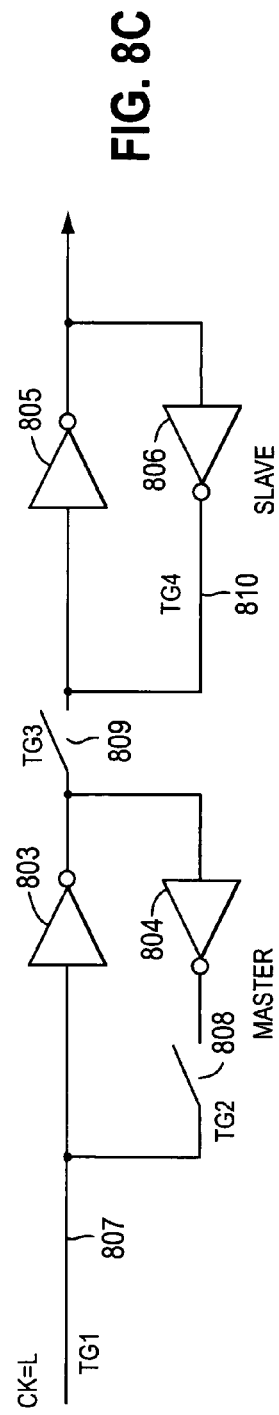
FIG. 8A
FIG. 8B
FIG. 8C

INVERTER/TRANSMITTER

CK=L (INVERTER)

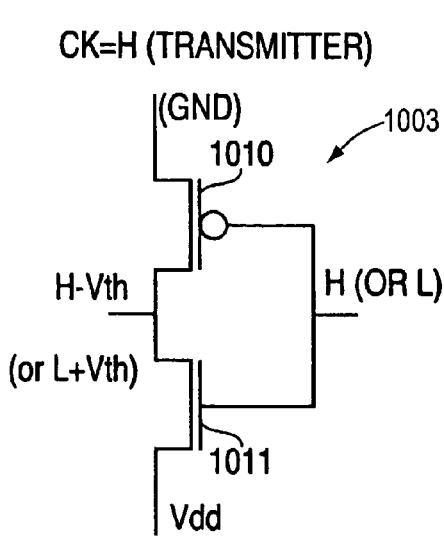
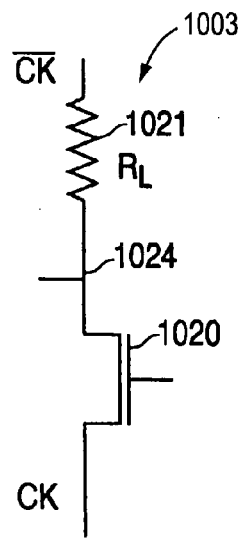
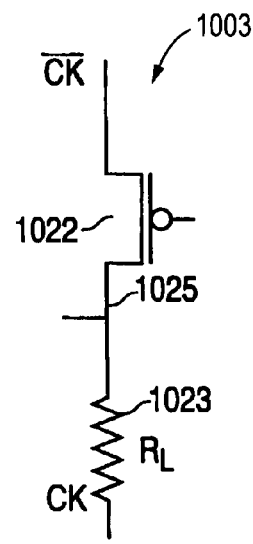
FIG. 10D      FIG. 10E      FIG. 10F
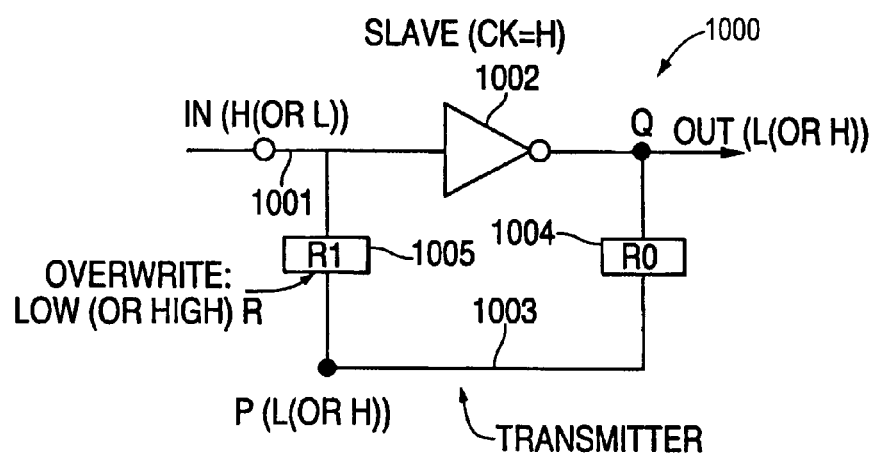
FIG. 10G

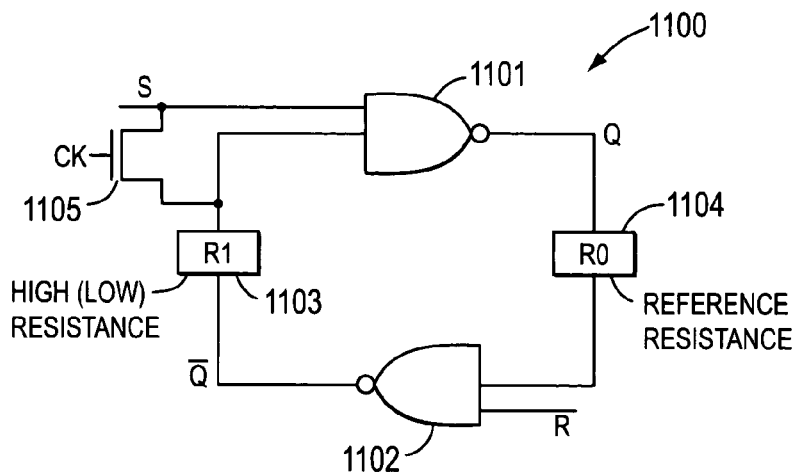
FIG. 11A
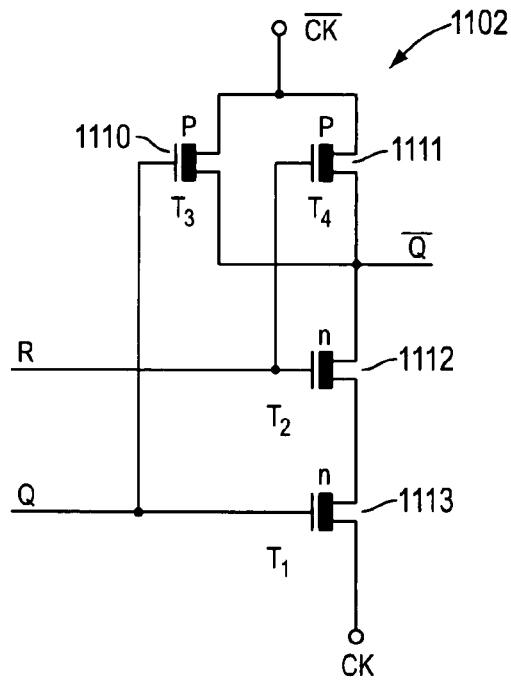
FIG. 11B
| R | Q | CK=L (NAND) | CK=H (AND) |
|---|---|---|---|
| 0 | 0 | 1 | 0 |
| 1 | 0 | 1 | 0 |
| 0 | 1 | 1 | 0 |
| 1 | 1 | 0 | 1 |
FIG. 11C

NONVOLATILE MEMORY FOR LOGIC CIRCUITS

RELATED APPLICATIONS

The present application claims priority to Provisional Application No. 60/620,236, "Nonvolatile Sequential Circuits," by Shinobu Fujita and Thomas H. Lee, filed on Oct. 18, 2004, which is herein incorporated by reference in its entirety.

BACKGROUND

1. Field of the Invention

The present invention relates to memory circuits and, in particular, to memory circuits with nonvolatile memories.

2. Discussion of Related Art

Sequential logic circuits are utilized in numerous systems. Currently, logic circuits and processors based on these sequential circuits consume high amounts of power. Further, it is expected that the power consumption will increase with decreasing dimensions of semiconductor components utilized in the sequential logic circuit. In particular, in the generation after the current MOSFET 65 nm technology, it is expected that static power consumption due to gate electrode leakage will become larger than the dynamic power consumption due to turning on and off of MOSFET transistors.

Conventional methods for decreasing power consumption of a circuit based on MOSFETs involves the use of two kinds of MOSFETs having different threshold voltages or involves regulation of the threshold voltage of MOSFETs by controlling substrate bias and supply voltage. However, the reduction of supply voltage should be limited in these methods because data stored in volatile memory cells may be easily lost when supply voltages are reduced. Further, static gate leakage, which increases as the gate oxide becomes thinner, is inevitable. Therefore, the real effects of these types of power consumption reducing techniques are limited.

A more effective method of reducing the power consumption of a sequential logic circuit is to shut the voltage off to that circuit completely. This technique is not possible in conventional sequential logic circuits because, as soon as the power is shut off, the data stored in the circuit is lost. A proposed memory system for reducing the power in this manner is shown in FIG. 1. A Memory cell 100 shown in FIG. 1 is proposed in IEICE Technical Report ICD 2002-10 (2002) p. 13 (Japan). Memory cell 100 represents a D-latch type of memory circuit, in which data can be stored in cross-coupled inverters 102 and 104. Transmission gates 101 and 103 provide voltages to a storage cell 110 in accordance with a clock signal CK and thereby can act as switches. A transmission gate 105 is coupled between inverters 102 and 104. Ferroelectric memory cells 107 and 106 are coupled from either side of inverter 104 to a plate line 108. Ferroelectric memory cell 107 is coupled between one terminal of inverter 104 and plate line 108 and ferroelectric memory cell 106 is coupled between the opposite terminal of inverter 104 and plate line 108.

Digital data is stored in memory cell 100 by applying voltages to ferroelectric memory cells 107 and 106 through plate line 108. Due to the difference between the amount of charge on ferroelectric cell 107 versus the amount of charge on ferroelectric cell 106, the data stored in ferroelectric memory cells 107 and 106 is transferred to volatile storage cell 110 when power is re-applied to memory cell 100. Data from storage cell 110 is written into nonvolatile ferroelectric memory cells 107 and 106 when sufficient voltage is applied to plate line 108.

Many ferroelectric materials used in Ferroelectric memory cells, however, exhibit poor endurance when subjected to repeated write/erase operations. In many cases, the endurance is limited to about $10^{14}$ operations even for high quality ferroelectric materials formed directly on a silicon substrate. The endurance may be seriously degraded for ferroelectric materials stacked on silicon devices on a silicon substrate. Because memories in logic circuits are repeatedly rewritten in accordance with the clock signal, a typical number of operations exceeds $10^{14}$ in a single month of operation in a 100 MHz clock, after which the logic circuits may become unreliable or no longer function.

In addition to the endurance difficulties, high quality ferroelectric materials are only formed directly on a silicon substrate and cannot easily be stacked. Additionally, memory cell 100 includes additional plate lines 108 and other circuits for control of the plate line voltages needed to write data to the memory cell. Consequently, the area utilized by memory cell 100 can become large.

Therefore, there is a need for memory cells that can easily store data while being powered down in order to reduce the power usage of sequential logic circuits or other data storage circuits.

SUMMARY

In accordance with the present invention, embodiments of nonvolatile two-terminal memory cells are presented. In accordance with some embodiments of the present invention, a memory cell can include resistances that can be electrically varied to store data. In some embodiments, the memory cells can be embedded in interconnects of silicon based integrated circuits.

A memory circuit according to the present invention includes a volatile data storage circuit and at least one nonvolatile memory coupled within the volatile data storage circuit, wherein the at least one nonvolatile memory includes a high resistive state and a low resistive state. The volatile data storage circuit can include, for example, cross-coupled inverters, cross-coupled NAND gates, or another volatile data storage circuit. The nonvolatile memories can include, for example, a spin-injection magnetic tunnel junction memory, a magnetic tunnel junction memory, a metal insulator phase change memory, an organic memory, or some other memory with at least two resistive states.

A method of retaining data on power down according to the present invention includes storing data in the volatile data storage circuit that stores data; writing the data as one of a plurality of resistance states of a nonvolatile memory; and reading the data stored in the nonvolatile memory to restore data in the volatile data storage circuit.

A process of producing a nonvolatile memory element according to the present invention includes depositing CMOS circuits on a substrate, the CMOS circuits including volatile memory elements; forming at least one metallization layer coupled with the volatile memory elements; depositing an insulating layer over the at least one metallization layer; etching an access hole through the insulating layer to the at least one metallization layer; forming a nonvolatile resistive memory in the access hole; and depositing a top metallization layer over the insulating layer and the nonvolatile resistive memory to complete the nonvolatile memory element.

These and other embodiments are further discussed below with respect to the following figures.

BRIEF DESCRIPTION OF THE DRAWINGS

FIG. 5I shows an example timing diagram of operation of a nonvolatile RS latch according to some embodiments of the present invention.

FIGS. 6A, 6B, and 6C illustrate a read operation in the non-volatile RS latch illustrated in FIG. 5A.

FIGS. 7A, 7B, 7C, and 7D illustrate another embodiment of a nonvolatile RS latch according to some embodiments of the present invention.

FIGS. 8A, 8B, and 8C illustrate a master/slave type D flip-flop based on transmission gates.

FIGS. 10A, 10B, 10C, 10D, 10E, 10F, 10G, 10H, and 10I illustrate an embodiment of a slave circuit in a D flip-flop according to some embodiments of the present invention.

FIGS. 11A, 11B, 11C, 11D, and 11E illustrate an embodiment of an RS latch that can be utilized in a flip-flop according to the present invention.

In the figures, elements having the same designation have the same or similar function.

DETAILED DESCRIPTION

Figure 1:
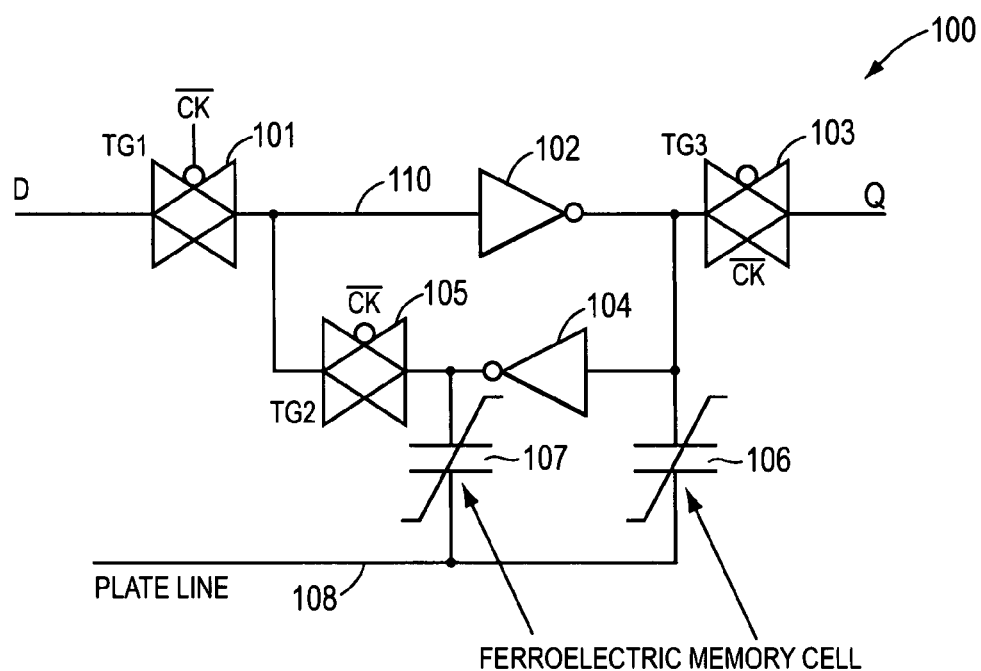
FIG. 1 shows a block diagram of a non-volatile memory cell utilizing ferroelectric memories.
Figure 2:
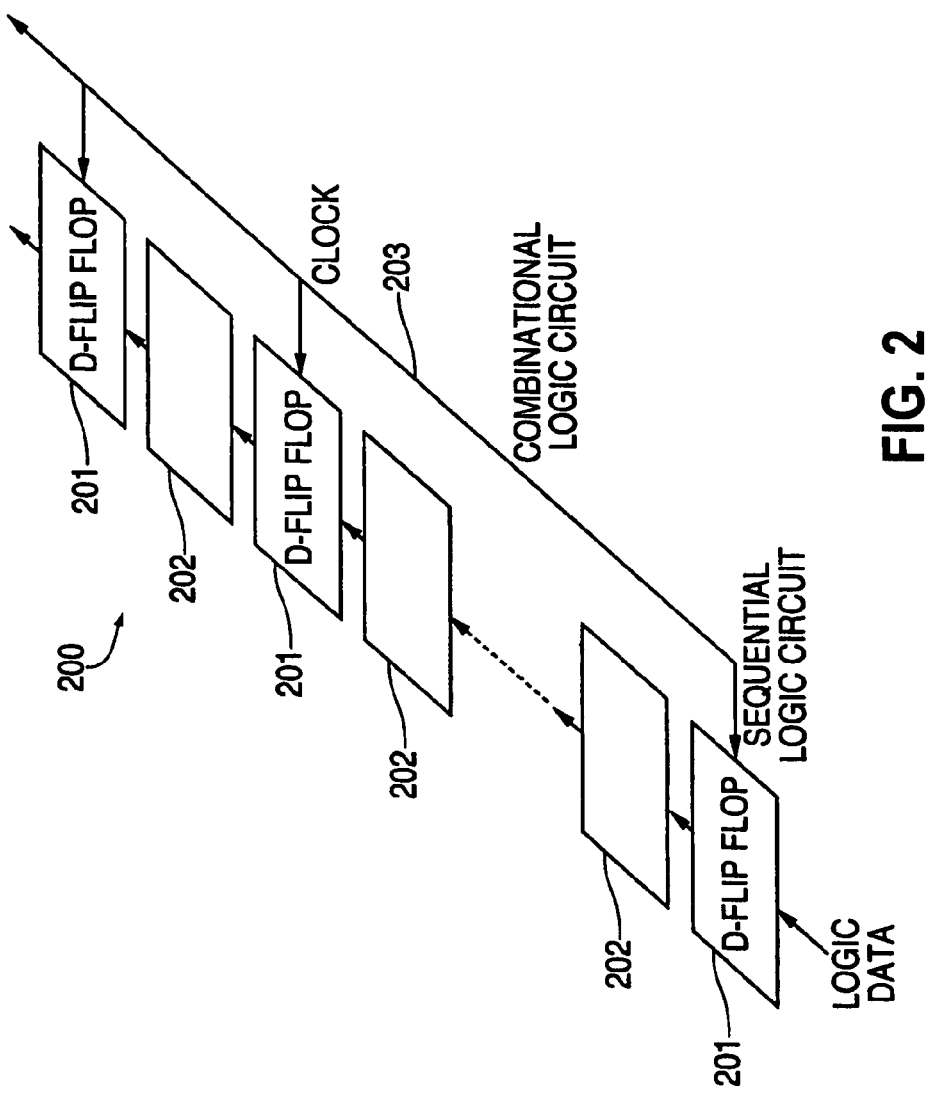
FIG. 2 shows a series of sequential logic circuits and combinational logic circuits.

FIG. 2 illustrates a combination of sequential logic circuits that can utilize memory circuits according to some embodiments of the present invention. As shown in FIG. 2, a sequential logic circuit 201 stores data for a combinational logic circuit 202. Further, once the operations of combinational logic circuit 202 are completed, the result can be stored in a sequential logic circuit 201. Each of sequential logic circuits 201 is clocked with a clock signal 203. One skilled in the art will recognize that a combinational logic circuit 202 can receive data stored in more than one sequential logic circuit 201. In embodiments of the present invention, sequential logic circuits 201 include non-volatile memory cells that retain data when power is shut down to the sequential logic circuit.

Figure 3:
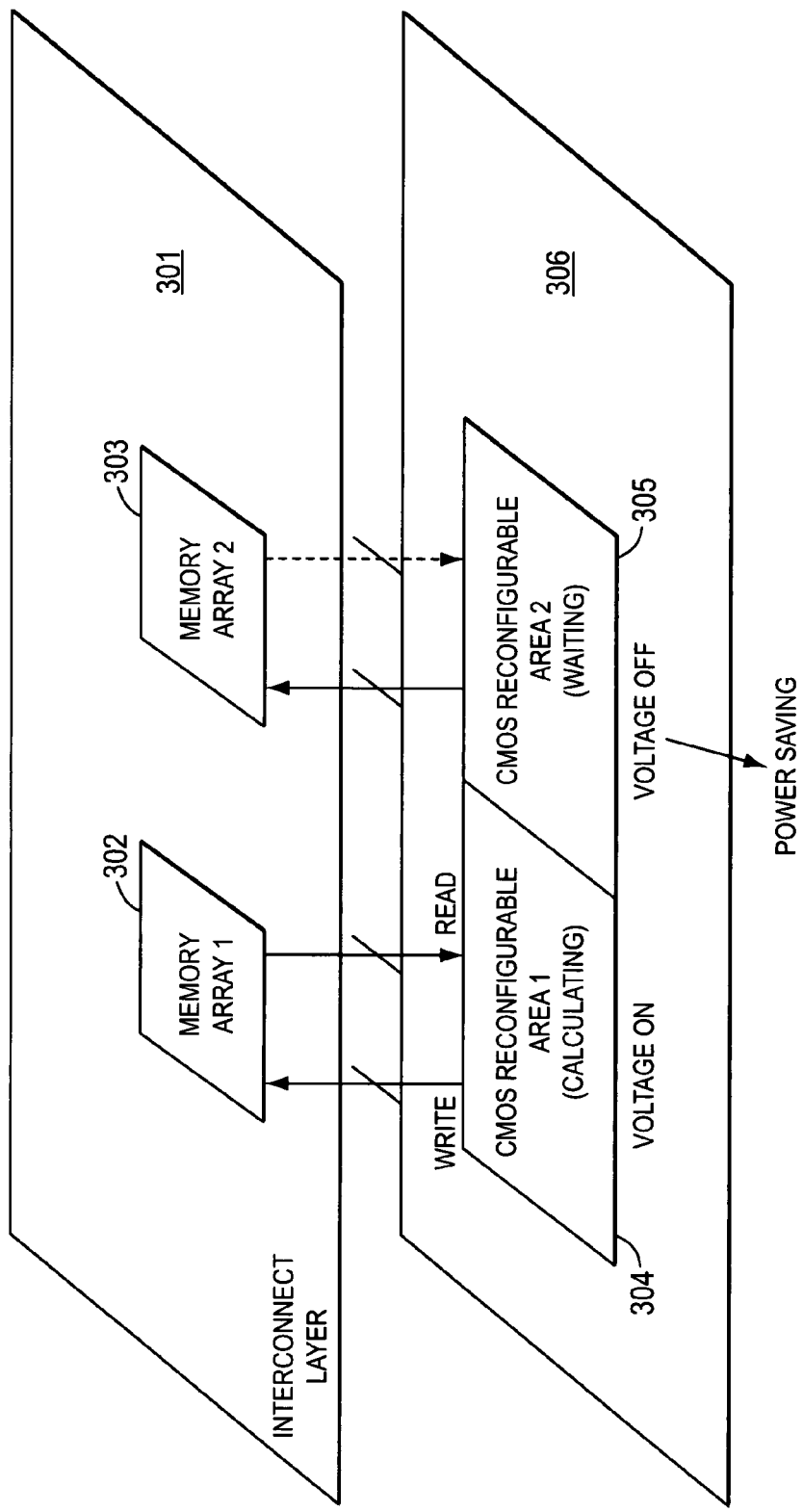
FIG. 3 illustrates a memory layout with sequential logic circuits according to embodiments of the present invention.

FIG. 3 illustrates a memory layout with memory arrays 302 and 303 according to embodiments of the present invention. Each of memories 302 and 303 include non-volatile memory cells. As is shown, memory array 302 is coupled to a CMOS logic circuit area 304 so that read and write operations can be performed on memory array 302 through an interconnect layer 301. Further, memory array 303 is coupled to a CMOS area 305 through interconnect layer 301 so that read and write operations can be performed between memory array 303 and CMOS area 305. CMOS area 304 and CMOS area 305 are formed in a substrate 306.

As is illustrated in FIG. 3, power may be turned off to each of areas 304 and 305. In the case shown, power is turned off to area 305 and therefore power is also turned off to memory array 303. However, memory array 303 includes volatile memory in combination with nonvolatile memory according to some embodiments of the present invention and therefore valid data remains stored in the nonvolatile memory of memory array 303 even when power is off. Data stored in the nonvolatile memory of memory array 303 can be retrieved once power is restored to memory array 303.

Examples of sequential digital logic circuits include D flip-flops and JK flip-flops. D flip-flops are the most frequently used and are utilized herein to explain aspects of the present invention. One skilled in the art can apply the principles shown here with respect to D flip-flops to JK flip-flops or other volatile memory structures.

Figure 4A:
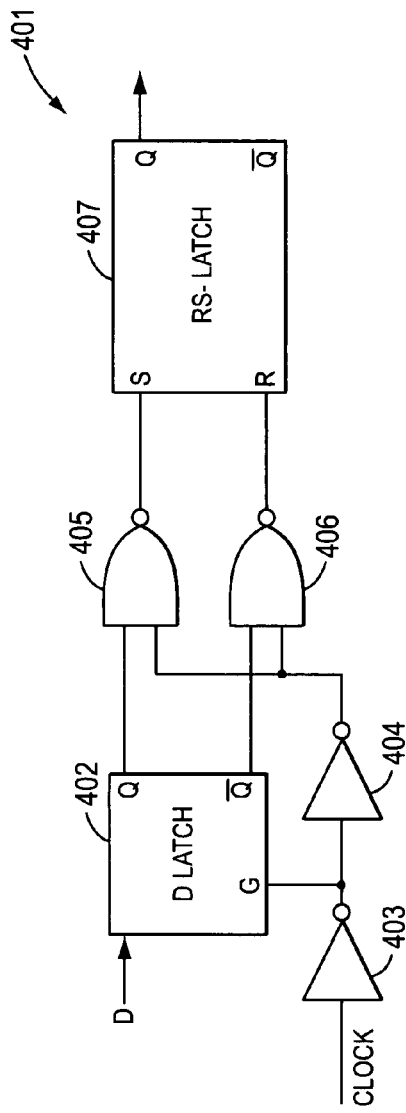
FIGS. 4A and 4B illustrate embodiments of a master-slave flip-flop and an edge-triggered flip-flop, respectively, according to some embodiments of the present invention.
Figure 4B:
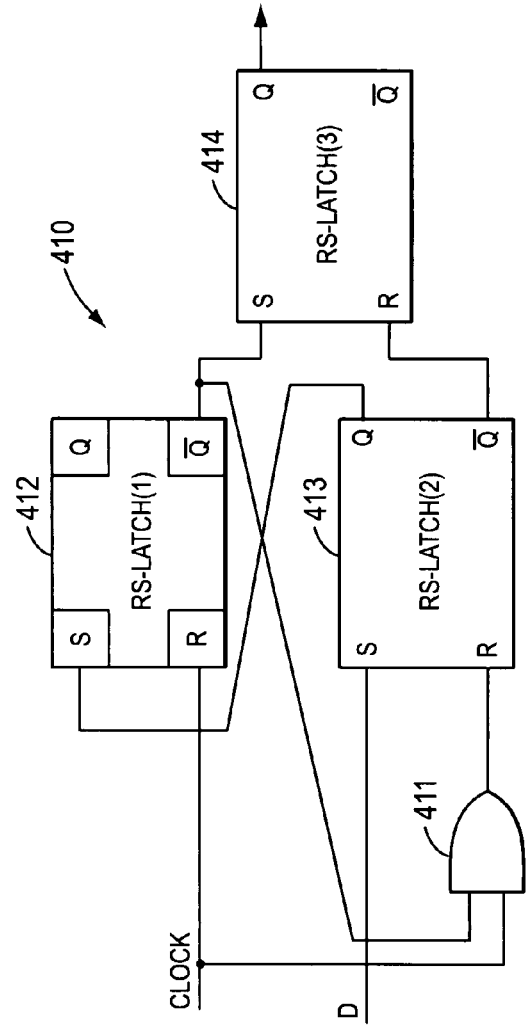

FIGS. 4A and 4B illustrate Master-Slave type 401 and Edge-Triggered type 410 D flip-flops, respectively. Both examples include non-volatile RS latches for storing output data even when power is not supplied. Input data D is transferred to the non-volatile RS latch when a clock signal (CK) becomes high.

In the embodiment of Master-Slave type flip-flop 401 shown in FIG. 4A, data D is input to a D Latch 402 when the clock signal G becomes high and data D is latched into D-latch 402 on the high to low transition of clock signal G. Inverters 403 and 404 provide the timing logic for flip-flop 401. The output signals Q and $\bar{Q}$ from D-latch 402 are input to NAND gates 405 and 406, respectively, along with the clock signal from inverter 404. The output signals from NAND gates 405 and 406 are then input to the set (S) and reset (R) inputs, respectively, of a nonvolatile RS-Latch 407. The output signal Q from RS-Latch 407 is the data stored in flip-flop 401. When the clock signal is high, the input signals S and R to RS latch 407 are the inverted symbol pairs Q and $\bar{Q}$ from D-latch 402. However, if the clock signal is low, a logic high is input to both S and R of RS latch 407.

Figure 4C:
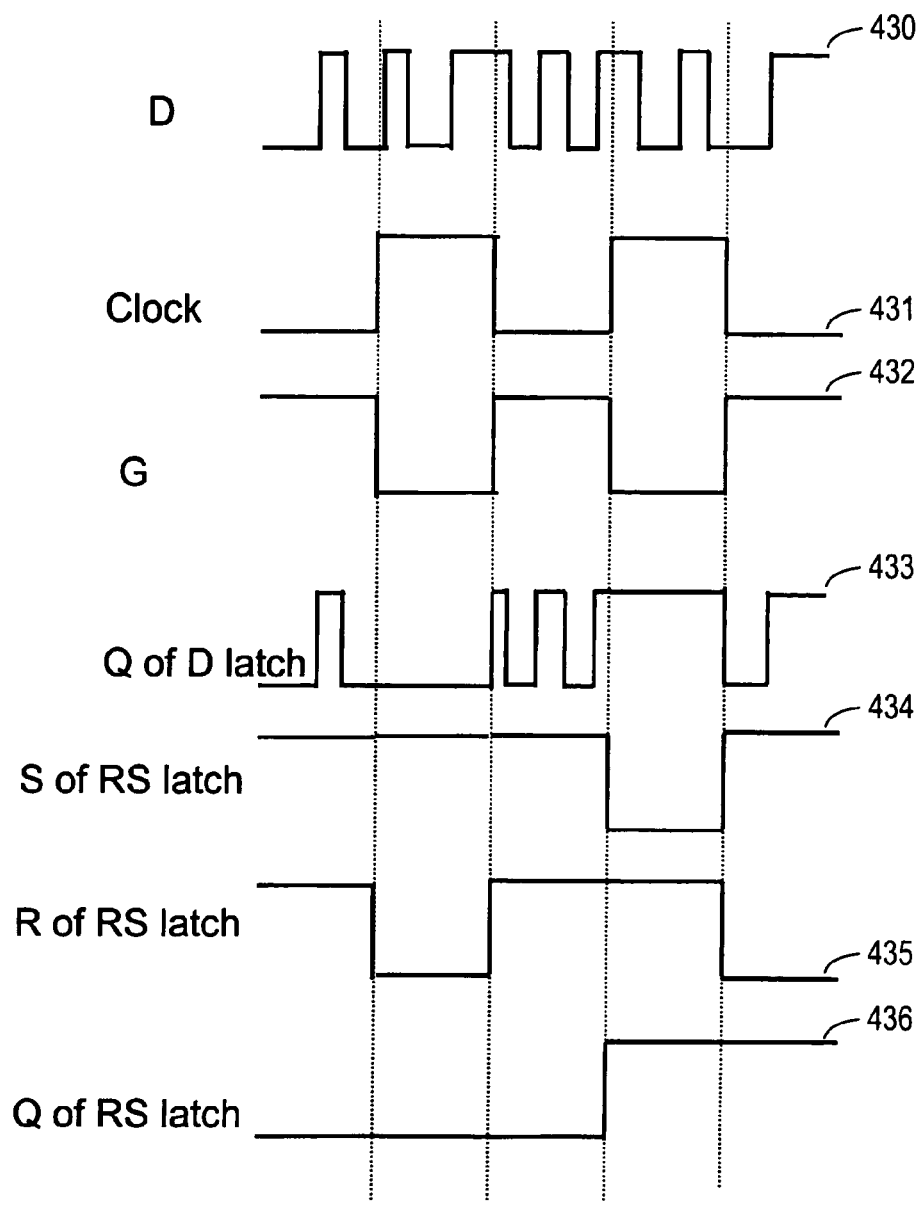
FIG. 4C illustrates an example timing diagram for the master-slave flip-flop shown in FIG. 4A.

FIG. 4C shows an example timing diagram illustrating the operation of the embodiment of flip-flop 401 shown in FIG. 4A. An example of input data D, which is input to D-latch 402, is shown as trace 430. The clock signal and the inverter clock signal, G, are shown as traces 431 and 432, respectively. The output signal from D-latch 402 is shown as trace 433. As shown in trace 433, the output signal from D-latch 402 follows the input signal D when the clock signal G is high but latches when clock signal G goes low. The set and reset inputs to RS latch 407 in the example shown in FIG. 4C are shown in traces 434 and 435, respectively. Finally, the output signal Q from RS latch 407 is shown in trace 436 (the output signal $\bar{Q}$ is the complement, or inverse, of the output signal Q from RS latch 407).

In edge-triggered flip-flop 410 shown in FIG. 4B, data is input to the S terminal of an RS latch 413 and the clock signal is input to the R terminal of an RS latch 412. The output signal Q from RS latch 413 is input to the S terminal of RS-latch 412 while the output signal $\bar{Q}$ from latch 412 is input to an AND gate 411 along with the clock signal. The output signal from AND gate 411 is input to the R terminal of RS latch 413. The output signal $\bar{Q}$ from RS latch 412 is input to the S terminal of non-volatile RS latch 414 while the output signal $\bar{Q}$ from RS latch 413 is input to the R terminal of non-volatile RS latch 414. As a result, data D is stored in the flip-flop formed by RS-Latches 412 and 413 and in non-volatile RS latch 414 on a rising edge of the clock signal.

Figure 4D:
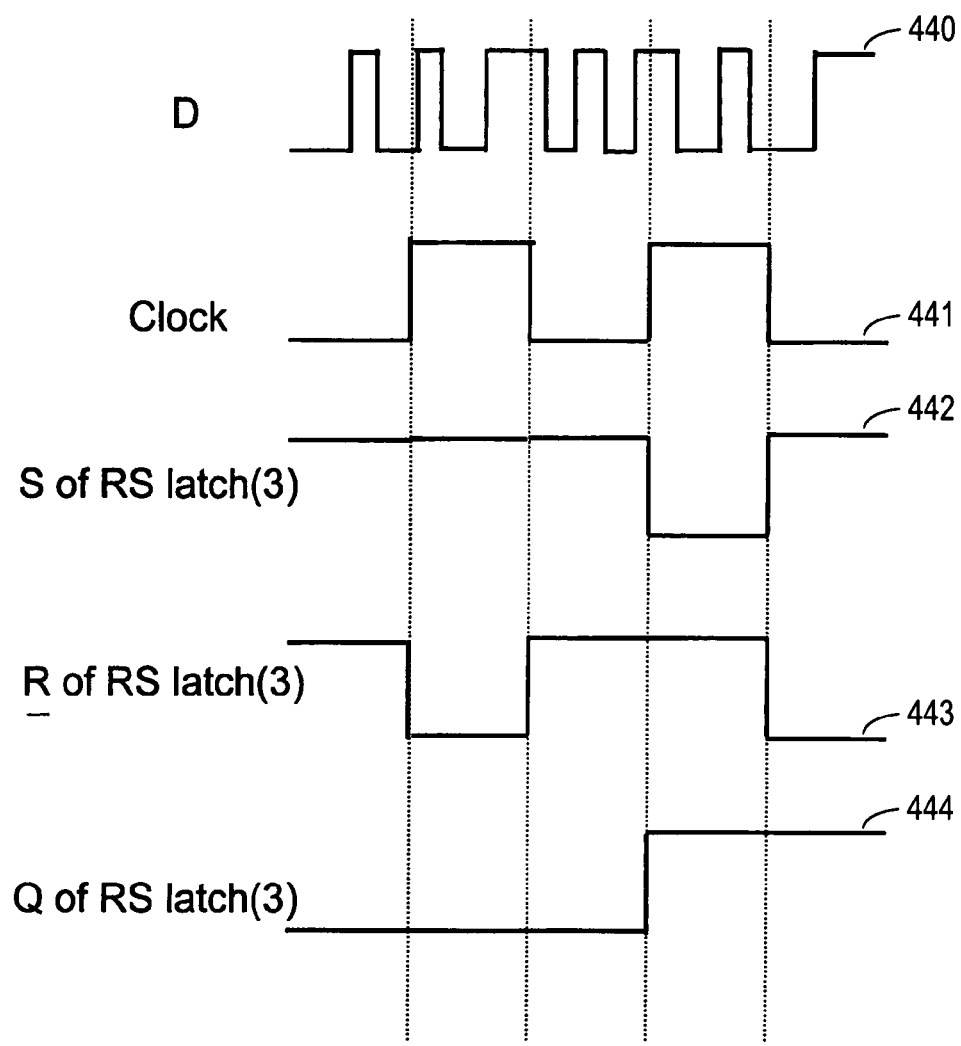
FIG. 4D illustrates an example timing diagram for the edge-triggered flip-flop shown in FIG. 4B.

FIG. 4D shows an example timing diagram illustrating the operation of edge-triggered flip-flop 410. Trace 440 shows an example input signal D, which is input to the set (S) terminal of RS latch 413. Trace 441 shows a clock signal that is input to AND gate 411. Traces 442 and 443 show the resulting signals S and R input to RS latch 414. Trace 444, then, shows the output signal Q from RS latch 414.

Figures 5A, 5B:
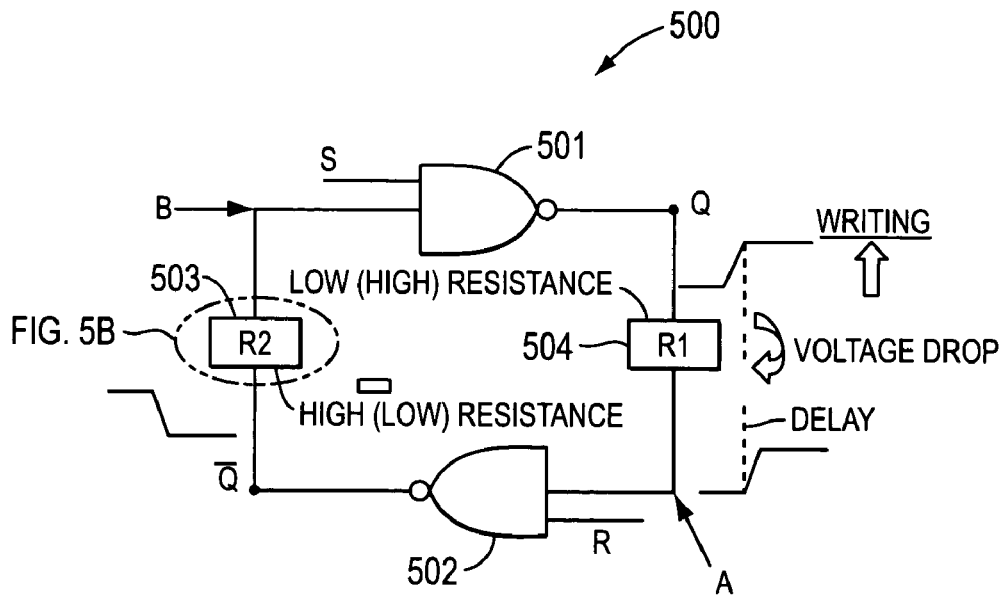
FIGS. 5A and 5B illustrate a write operation in a non-volatile RS latch according to some embodiments of the present invention.

FIG. 5A illustrates a non-volatile RS latch 500 according to some embodiments of the present invention. Nonvolatile RS latch 500 may, for example, be utilized as RS latch 407 in master-slave type flip-flop 401 shown in FIG. 4A or as RS latch 414 in edge-triggered type flip-flop 410 shown in FIG. 4B. The embodiment of non-volatile RS latch 500 shown in FIG. 5A includes two nonvolatile two-terminal memories 503 and 504, which are serially combined with cross-coupled NAND gates 501 and 502. In some embodiments, non-volatile memories 503 and 504 can be variable resistance memories, which have a high resistance state and a low resistance state.

FIG. 5B illustrates a write operation truth table for nonvolatile RS latch 500 shown in FIG. 5A. As shown in FIG. 5B, a write operation occurs when signals S and R are in opposite state (e.g., S=0 and R=1 or S=1 and R=0). In the embodiment shown in FIG. 5A, the output signal Q written into nonvolatile memory 500 follows the reset signal R.

Figure 5C:
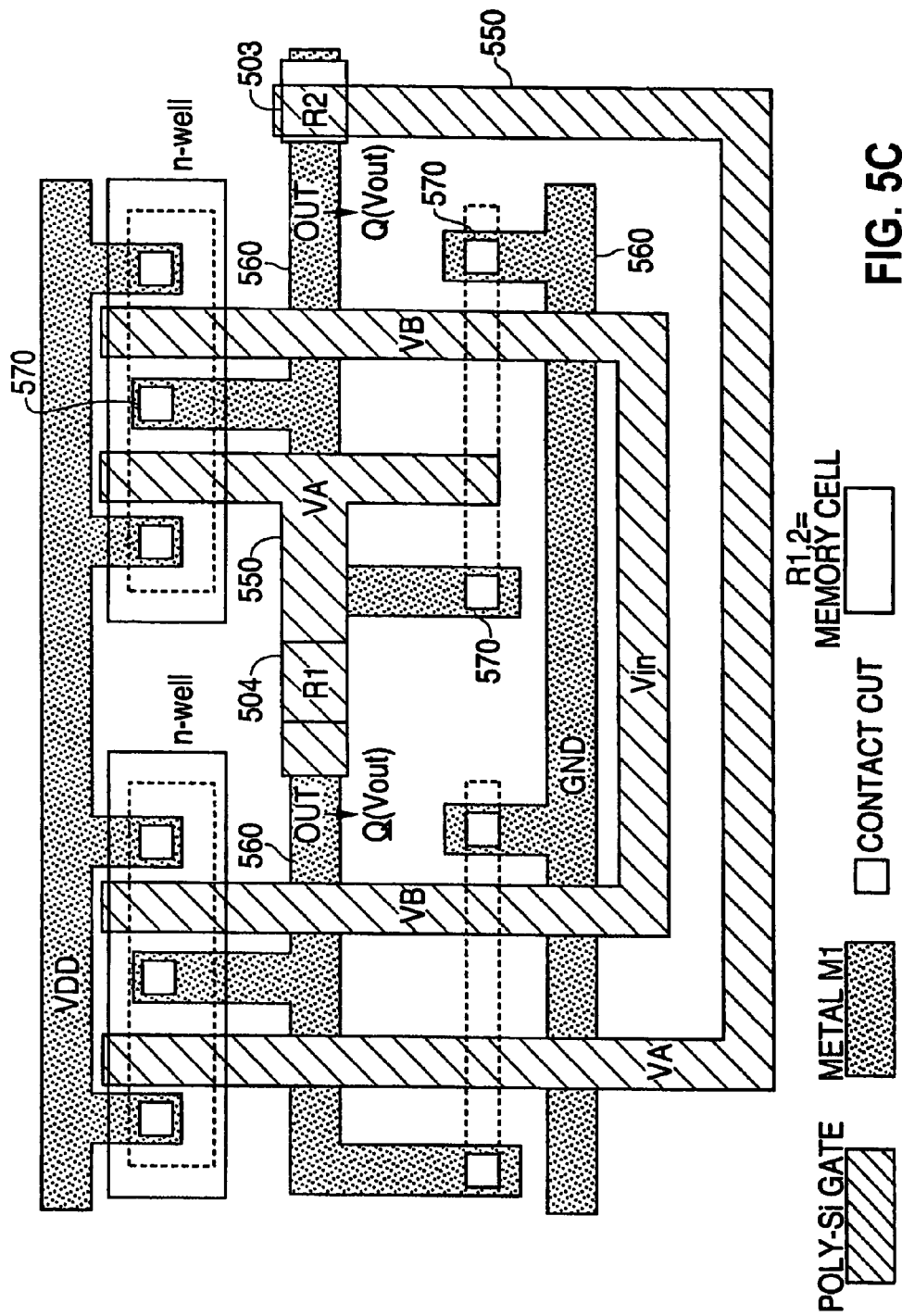
FIG. 5C illustrates a schematic plan view of a transistor level layout of an RS latch that includes nonvolatile memories according to some embodiments of the present invention.

FIG. 5C illustrates a schematic plan view of a transistor level layout of RS latch 500 as shown in FIG. 5A. As shown in FIG. 5C, nonvolatile memories 503 and 504 can be formed in polysilicon layers 550 and contact can be made with a metallization layer 560. Contacts with transistors can be formed with contact cuts 570. As such, memories 503 and 504 can be formed in the metallization layers of the semiconductor chip, and therefore can be stacked with other circuitry.

Figure 5D:
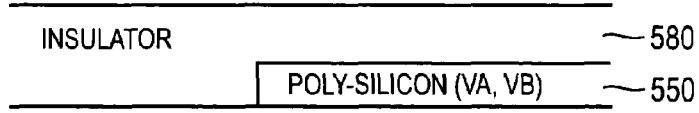
FIGS. 5D through 5H illustrate fabrication of nonvolatile memories between a polysilicon gate metal contact layer and a drain metal contact layer.
Figure 5E:
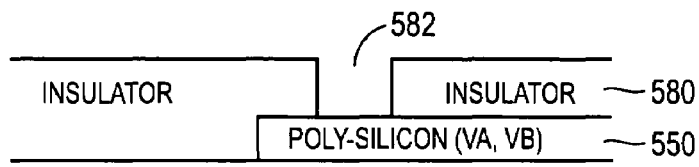
Figure 5F:
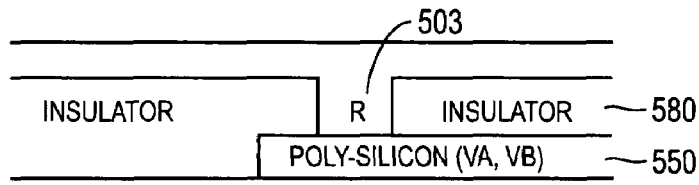
Figure 5G:
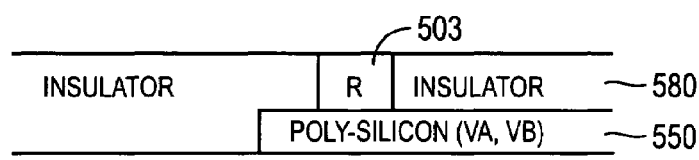
Figure 5H:
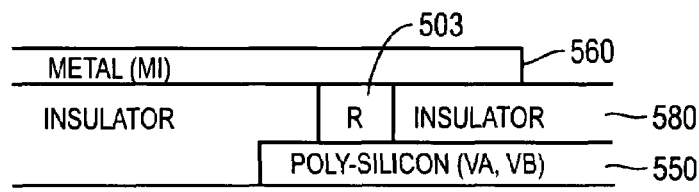
Figure 51:
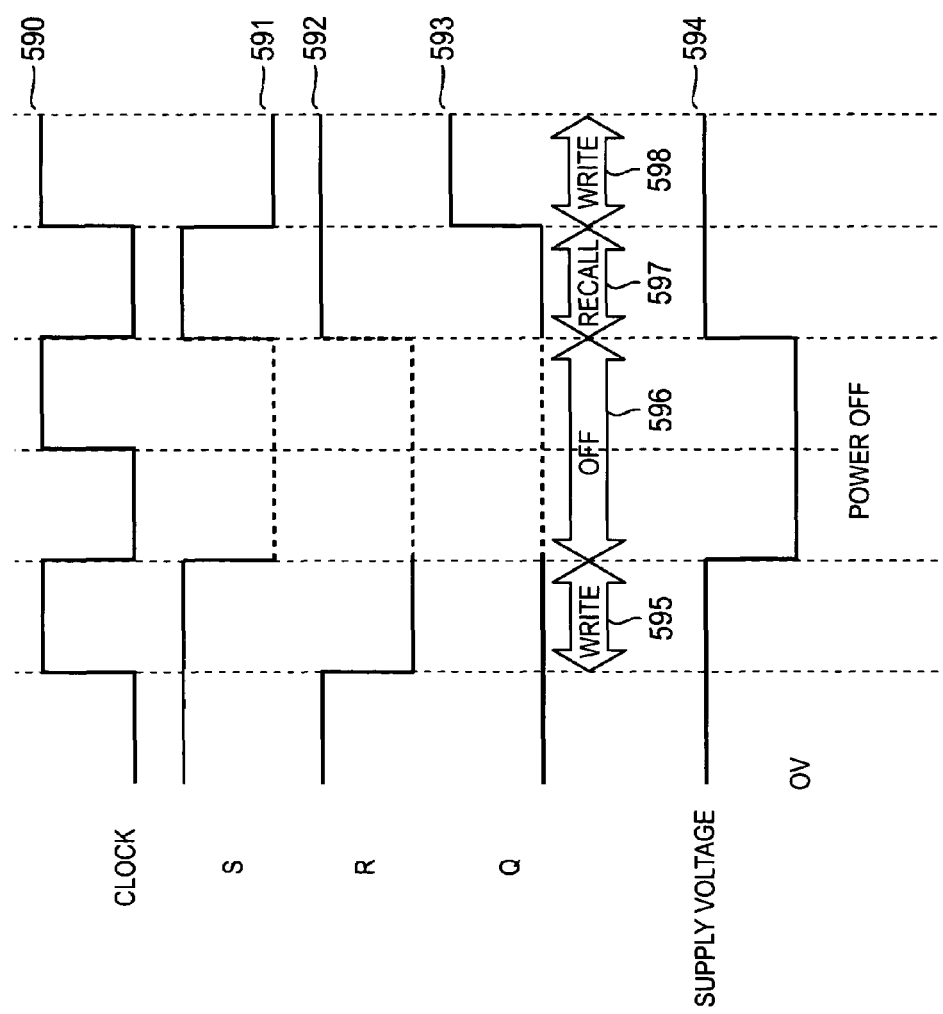

FIGS. 5D through 5H illustrate a process for fabrication of nonvolatile memory 503, for example, between polysilicon layer 550 serving as a gate metal contact and a metallization layer 560 service as a drain metal contact layer. As shown in FIG. 5D, an insulator layer 580 is deposited on polysilicon layer 550. Polysilicon layer 550, as shown in FIG. 5D, has been patterned and etched according to a CMOS process. Insulator layer 580 is then patterned and etched to form an access 582, as shown in FIG. 5E. The materials for formation of memory 503 are then deposited as shown in FIG. 5F. The materials for formation of memory 503 are then etched back to insulator 580 as shown in FIG. 5G. Finally, metallization layer 560 is deposited over memory 503 and insulator 580 as shown in FIG. 5H.

FIGS. 5C through 5H illustrate a two-terminal memory structure formed between two metal layers of a CMOS circuit. In some embodiments, memory 503 can be formed on top of all metal layers of CMOS, which is illustrate in FIGS. 12C, 13B, 14B, and 16 discussed in further detail below.

In some embodiments, the resistance states of memories 503 and 504 can be set by providing current through memories 503 and 504 of sufficient magnitude to set a resistance state of memories 503 and 504. The actual state is set by the polarity of the current passing through memory 503 or memory 504. In some embodiments, the resistance state of memories 503 and 504 can be set by applying a magnetic field to the memory. Current induced resistance settings that can be utilized for non-volatile memories 503 and 504 are known and described, for example, in Liu et al., "Current-Induced Magnetization Switching in Magnetic Tunnel Junctions," Appl. Phys. Lett. Vol. 82, No. 17, p. 2871-73 (Apr. 28, 2003); Ma et al., "Organic Electrical Bistable Devices and Rewritable Memory Cells," Appl. Phys. Lett. Vol. 80, No. 16, p. 2997-99 (Apr. 22, 2002); and Watanabe et al., "Current-Driven Insulator-Conductor Transition and Nonvolatile Memory in Chromium-Doped SrTiO3 Single Crystals," Appl. Phys. Lett., Vol. 78, No. 23, p. 3738-40 (Jun. 4, 2001), each of which is incorporated by reference herein in their entirety. These variable resistance memory devices can be deposited readily within the memory structures as described herein.

Initially, the resistance of non-volatile memories 503 and 504 as shown in FIG. 5A can be set at a low level. In some embodiments, a high level resistance is defined as a logic "0" while a low level resistance is defined as a logic "1," although the particular logical designations are arbitrary. The polarity of memory 504 can be selected so that when signal Q is a logic "1" and signal A is a logic "0" memory 504 is set to a low resistance state, and when signal Q is a logic "0" and signal A is a logic "1" memory 504 is set to a high resistance state. Additionally, the polarity of memory 503 (when the polarity of memory 504 is selected as above) can be selected so that when signal $\bar{Q}$ is a logic "1" and signal B is a logic "0" memory 503 is set to a low resistance state, and when signal $\bar{Q}$ is a logic "0" and signal B is a logic "1" memory 503 is set to a high resistance state. The output signal Q is the inverse of output signal $\bar{Q}$. In the case of output signal Q being logic "0", when a logic "0" is then applied to set input (S) of NAND gate 501 and logic "1" is applied to reset input (R) of NAND gate 502, the output signal Q goes to logic "1" and signal $\bar{Q}$ goes to logic "0". With respect to non-volatile memory element 504, the time when the voltag across the non-voltile memory goes to logic "1" is delayed due to the resistance of non-volatile memory 504 and a voltage is applied across non-volatile memory 504. The current supplied by the voltage drop across non-volatile memory 504 is sufficient to place non-volatile memory 504 into a low resistance state, thus storing the logic "1". Simultaneously, memory 503 is set to a high resistance state, thus storing a logic "0".

Conversely, when a logic "1" is applied to set input (S) and a logic "0" is applied to reset input (R), non-volatile memory 503 is set to a low resistance state and non-volatile memory 504 is set at a high resistance state. The data written into non-volatile memory 503 and non-volatile memory 504 are complementary. In some embodiments, one of non-volatile memory 503 or 504 can be replaced with a fixed resistance having resistance between the high resistance level and the low resistance level of the remaining memory. In some embodiments, the polarities of memory 503 and memory 504 may be selected other than that described herein.

FIG. 5I illustrates a timing diagram for the embodiment of nonvolatile RS latch 500 shown in FIG. 5A used as one of nonvolatile RS latch 410 of master-slave flip-flop 401 shown in FIG. 4A or nonvolatile RS latch 414 of edge-triggered flip-flop 410 shown in FIG. 4B. Trace 590 shows a clock trace, since both flip-flop 401 and flip-flop 410 are sequential devices. Trace 591 illustrates an example S signal applied to RS latch 500 shown in FIG. 5A. Trace 592 is an example R signal applied to RS latch 500 shown in FIG. 5A. Trace 593 illustrates the resulting output signal Q from RS latch 500. As discussed above, when S is "high" and R is "low," a "low" signal is written into RS latch 500. Trace 594 illustrates an example cycling of the supply voltage in a power-on situation and a power-off situation. In clock cycle 595, the supply voltage is on, S is "high," and R is "low." As a result, a "low" signal is written into RS latch 500 and the output signal Q becomes "low." During clock cycles 596, the power is turned off to RS latch 500. Therefore, signals S, R, and Q are all 0 volts.

In clock cycle 597, power is restored to RS latch 500 and, as described above, the data stored in nonvolatile memories 503 and 504 is recalled. As shown in FIG. 5I, the signals S and R during clock cycle 597 are both set to "high," causing the data stored in memories 503 and 504 to be recalled. Once again, RS latch 500 outputs the "low" signal written during period 595. During clock cycle 598, a new write operation is performed and, since S is now "low" and R is now "high," a "high" signal is written into RS latch 500.

FIGS. 6A, 6B, and 6C illustrate a read operation with an embodiment of non-volatile RS latch 500 after data has been written into RS latch 500 and the power has been turned off to RS latch 500. The data stored between cross-connected NAND gates 501 and 502 is lost, however the data stored in memories 503 and 504 is retained in the resistive states of memories 503 and 504. FIG. 6A illustrates RS latch 500 during the powered down period. FIG. 6B shows an equivalent circuit 600 where S=R=1, which occurs during repowering of RS latch 500. As shown in FIG. 6B, NAND gates 501 and 502 become inverters.

As shown in FIG. 6C, when the power is turned back on to RS latch 500 a read operation is performed by applying a logic "1" to both the set (S) and reset (R) inputs to RS latch 500 (i.e., the (S) terminal of NAND gate 501 and the (R) terminal of NAND gate 502). Under that condition, NAND gates 501 and 502 can be represented as inverters 601 and 602 as shown in FIG. 6B. Because the input signals into both inverters 601 and 602 initially are both logic "0"s, both output Q and $\bar{Q}$ become logic "1". However, the state Q=$\bar{Q}$ is unstable in a flip-flop. If the resistance of non-volatile memory 503 is greater than that of non-volatile memory 504, then the output value Q will go to logic "1" and the output value of $\bar{Q}$ will go to logic "0" because the time delay through memory 503 is longer than that through memory 504. The time delay through the higher resistance memory is longer than the time delay through the lower resistance memory. Therefore, memory 503 is set to a low resistance state because logic "1" is delayed through memory 503. Thus the state of memory 503 returns to the initial state.

Conversely, if the resistance of memory 504 is larger than that of memory 503 the output Q will go to logic "0" and $\bar{Q}$ will go to logic "1". Therefore, the previous data that was stored in RS latch 500 before the power was turned off is recalled and reinstated in RS latch 500 upon power-up. As before, memory 503 is set to a low resistance state because logic "1" is delayed through memory 503. Therefore, the memory state returns to the initial state.

Returning to Master-Slave flip-flop 401 illustrated in FIG. 4A, when the clock signal is low, both of the outputs of NAND gates 405 and 406 become logic "1" regardless of the output signal from D-latch 402. Therefore, the input signals to the S terminal and the R terminal of RS-latch 401 are both logic "1". The data stored in non-volatile memories, therefore, can be recalled as described above for RS-latch 500. Additionally, in edge-triggered flip-flop 410 shown in FIG. 4B, when the clock signal is low, both of the inputs R of RS latches 412 and 413 are logic "0" regardless of the feedback from the output $\bar{Q}$ of RS latch 412. Since R is logic "0", the output Q of latches 412 and 413 is logic "1" regardless of the value applied to the S terminal of either of RS latches 412 or 413, as illustrated in the logic table shown in FIG. 5B. Therefore, the input signal S and input signal R to RS latch 414 are both logic "1". Therefore, the data stored in the non-volatile memories can be recalled in RS latch 414 as illustrated in FIGS. 6A, 6B, and 6C.

In the configuration shown in either of FIG. 4A or 4B, then, data stored in non-volatile RS latch 407 or 414 is retrieved within one clock cycle of re-powering of either of flip-flops 401 or 410. In both flip-flops 401 and 410, when the clock signal is high the input signals to the S terminal and R terminal of RS latch 407 and RS latch 414 are complementary with polarity dependent on the data D. Therefore, a write operation to the non-volatile memories of RS latch 407 and RS latch 414 of data D proceeds as was described above with respect to FIGS. 5A and 5B.

FIGS. 7A, 7B, 7C, and 7D illustrate another embodiment of a nonvolatile RS latch 700 according to the present invention. The embodiment of RS latch 700 shown in FIG. 7A includes cross-coupled NAND gates 501 and 502 as well as nonvolatile memories 503 and 504 as illustrated and described with respect to FIGS. 5A and 5B as well as FIGS. 6A, 6B, and 6C. However, transistors 701, 702, 703, and 704 have been added. Transistor 701 is coupled between NAND gate 502 and memory 504. Transistor 702 is coupled between a terminal of memory 504 and a voltage B, which can be ½ Vdd. Transistor 703 is coupled between NAND gate 501 and memory 503. Transistor 704 is coupled between a terminal of memory 503 and a voltage A, which can also be ½ Vdd. The gates of transistors 704 and 702 are coupled to an exclusive OR (XOR) gate 706 that receives the voltages on the S terminal and R terminal of RS latch 700. The gates of transistors 703 and 701 are coupled to XOR gate 706 through an inverter 705. Each of transistors 701, 702, 703, and 704 can be an N-type MOSFET.

As a result, the exclusive OR (XOR) of signals S and R is applied to the gates of transistors 704 and 702. The inverted XOR of S and R is applied to the gates of transistors 701 and 703. When S is not the same as R, XOR of S and R is logic "1" and transistors 702 and 704 are turned on. Memories 503 and 504 then are coupled to voltages A and B, respectively, as shown in FIG. 7D, which illustrates the equivalent circuit of latch 700 when the signals S and R are not equal. For example, when S="1" and R="0", the output signal from NAND gate 501, Q, in FIG. 7D becomes "1" and Vdd is applied to one terminal, the terminal coupled to signal Q, of memory 504 while voltage B, ½ Vdd, is applied to the opposite terminal of memory 504. In contrast, when R="0" then $\bar{Q}$ becomes "0" and zero voltage is applied to a terminal of memory 503, which is coupled to $\bar{Q}$, and voltage A, which can be ½ Vdd, is applied to the opposite terminal of memory 503. Complementary data is then written into memories 504 and 503. The case where S="0" and R="1" results in the opposite complementary data being written into memories 503 and 504. The truth table shown in FIG. 7B illustrates the output signals of Q and $\bar{Q}$, and therefore the data written into memories 503 and 504, with input signals S and R.

When S=R="1", the output signal from XOR 706 is "0" and therefore transistors 703 and 701 are turned on and transistors 702 and 704 are off, resulting in the equivalent circuit shown in FIG. 7C. The circuit shown in FIG. 7C is identical to that shown in FIG. 6A and is therefore "read" in the way discussed with FIG. 6A.

Therefore, RS latch 700 as shown in FIG. 7A can be utilized as a nonvolatile RS latch in a D type flip-flop. Again, one of memories 503 and 504 can be replaced with a fixed resistance where the resistance of the fixed resistor is between the high level of resistance and the low level of resistance of the remaining memory.

FIGS. 8A, 8B, and 8C illustrate a master/slave type D flip-flop 800 based on transmission gates. Flip-flop 800 includes a master 801 and a slave 802. The input signal D is input to a transmission gate 807, which is open on a high clock signal and closed on a low clock signal. Master 801 includes cross-coupled inverters 803 and 804 with a transmission gate 808 coupled between them. Transmission gate 808 is closed on a high clock signal and open on a low clock signal. The output signal from inverter 803 is coupled to an input terminal of a transmission gate 809. An output terminal of transmission gate 809 is coupled to slave 802. Transmission gate 809 is closed on a high clock signal and open on a low clock signal. Slave circuit 802 includes inverters 805 and 806 cross-coupled together with a transmission gate 810 coupled between them. Transmission gate 810 is open on a high clock signal and closed on a low clock signal. The output signal Q is taken as the output signal of inverter 805.

FIG. 8B illustrates the configuration of D flip-flop 800 when the clock signal is high. As before, transmission gates 807 and 810 are open and transmission gates 808 and 809 are closed. Data is then stored in master 801 and transferred to slave 802 through transmission gate 809.

FIG. 8C illustrates the case when the clock signal is low. Transmission gates 807 and 810 are now closed and transmission gates 808 and 809 are open. In that case, new data D is transferred to master 801 through now closed gate 807 and the data transferred to slave 802 during the high clock signal is stored in slave 802.

Figure 9A:
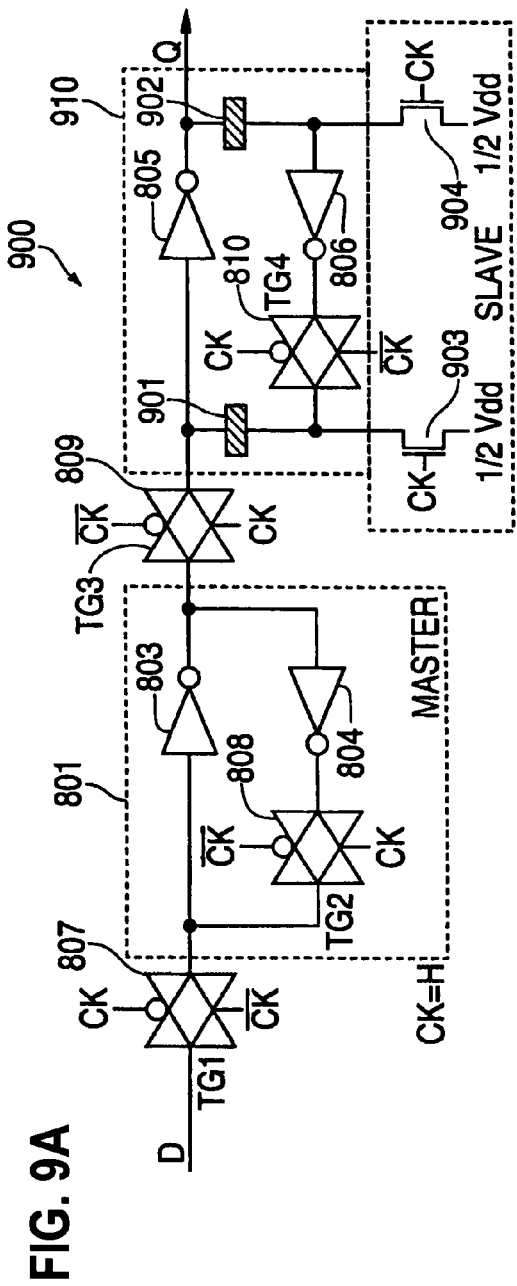
FIGS. 9A, 9B, and 9C illustrate an embodiment of a D flip-flop according to some embodiments of the present invention.
Figure 9C:
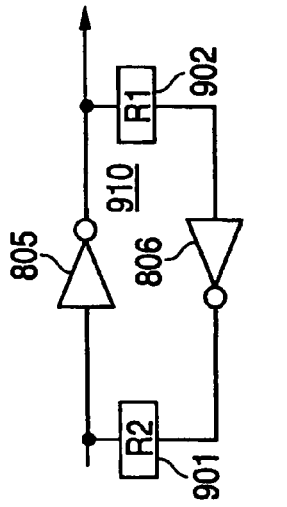
Figure 9B:
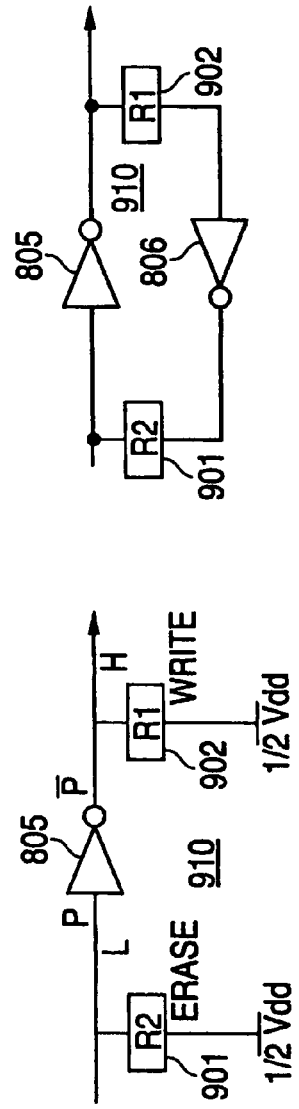

FIGS. 9A, 9B, and 9C illustrate an embodiment of a D flip-flop 900 according to the present invention. As shown in FIG. 9A, D-flip-flop 900 includes master 801, transmission gate 807, and transmission gate 809 as illustrated and described with respect to FIGS. 8A, 8B, and 8C. However, slave 802 of FIG. 8A is replaced with a slave 910 in FIG. 9A. Slave 910 includes cross-coupled inverters 805 and 806 and transmission gate 810 as shown in FIG. 8A. However, a memory 902 is coupled between the output terminal of inverter 805 and the input terminal of inverter 806. The output terminal of inverter 805 is coupled to a terminal of transmission gate 810. The opposite terminal of transmission gate 810 is coupled to a terminal of a memory 901. The opposite terminal of memory 901 is coupled to the input terminal of inverter 805, which is also coupled to a terminal of transmission gate 809. The output signal Q is taken from the output terminal of inverter 805.

Further, a transistor 904 can be coupled between the input terminal of inverter 806 and a voltage, which can be ½ Vdd. Another transistor 903 can be coupled between a terminal of transmission gate 810 opposite the output terminal of inverter 806 to the voltage. The gates of transistors 903 and 904 are coupled to the clock signal CK.

When the clock signal CK is low, transistors 903 and 904 are open and transmission gate 810 is closed. Therefore, an equivalent circuit of slave 910 during a low clock signal is shown in FIG. 9C. Data is stored in the cross-coupled pair of inverters 805 and 806 and memories 901 and 902, as has been discussed previously. Further, data can be read out in this configuration on power-up as has been discussed above since that data is stored in the resistive states of memories 901 and 902.

When the clock signal CK is high, transistors 903 and 904 are closed and transmission gate 810 is open, as illustrated in the equivalent circuit for slave 910 shown in FIG. 9B. In this case, data from transmission gate 809, which is also closed, is written in complementary fashion into memories 901 and into 902 through inverter 805. The data value at transmission gate 809 is a logic "1" at Vdd, or a logic "0" at zero volts. Therefore, current respectively flows in opposite directions through memories 901 and 902 and the current is sufficient to set the resistance of each memory to either the high resistance state or the low resistance state, depending on the direction of current through the memory.

Therefore, flip-flop 900 acts as a non-volatile D type flip flop in which data in slave 910 is preserved on power down and can be reinstated on power-up of the circuit. Data is read from memories 901 and 902 on a low clock cycle and written to memories 901 and 902 on a high clock cycle. The equivalent circuit of flip-flop 900 when the clock signal is low is illustrated in FIG. 9C while the equivalent circuit of flip-flop 900 when the clock signal is high is illustrated in FIG. 9B.

Figure 10A:
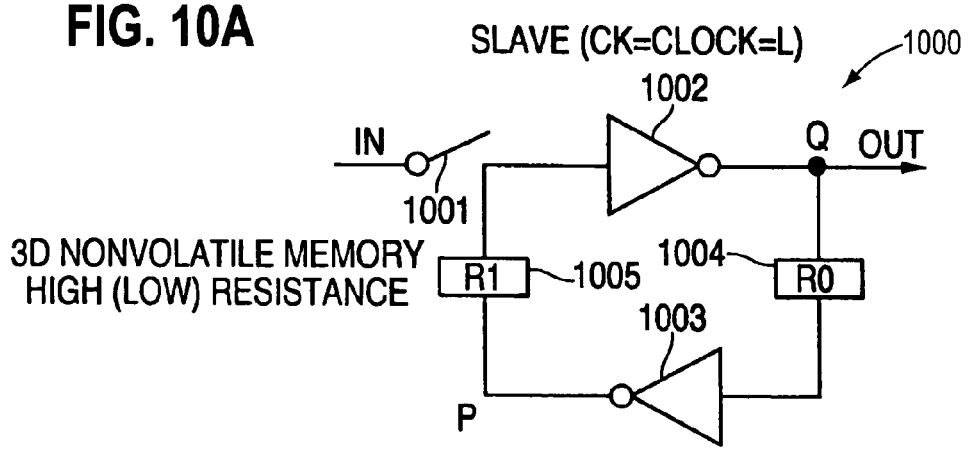
Figure 10B:
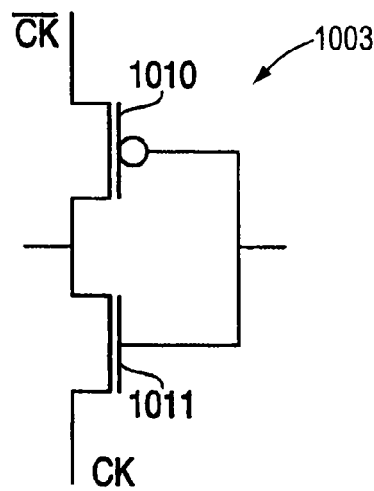
Figure 10C:
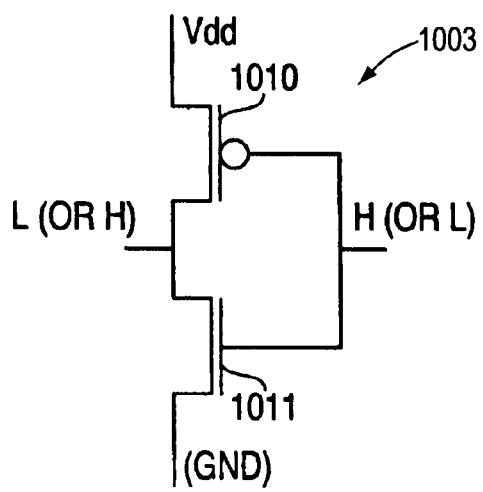
Figure 10H:
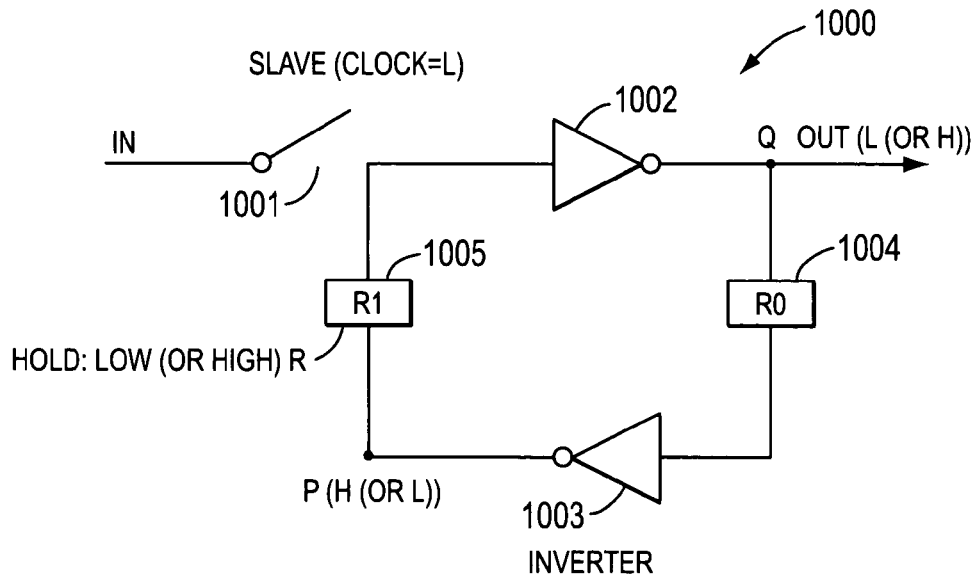
Figure 10I:
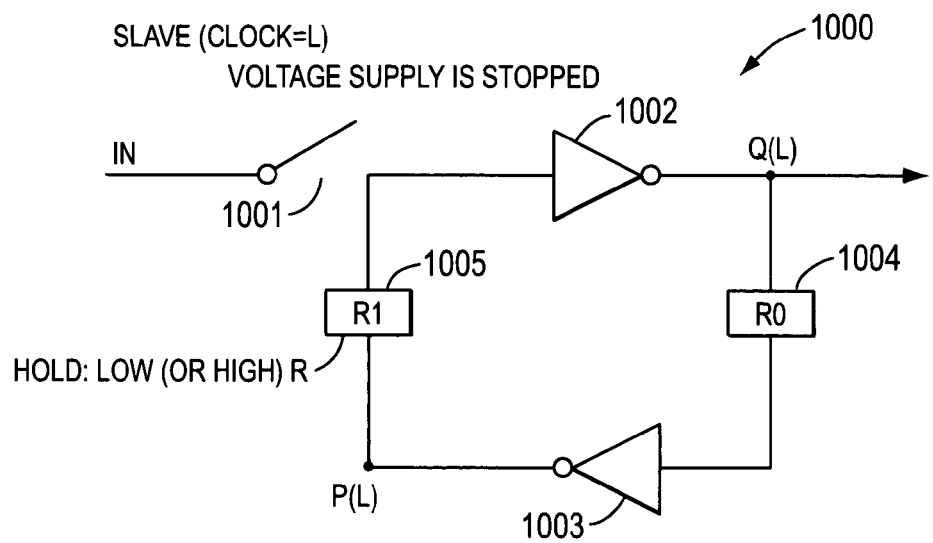
Figure 10J:
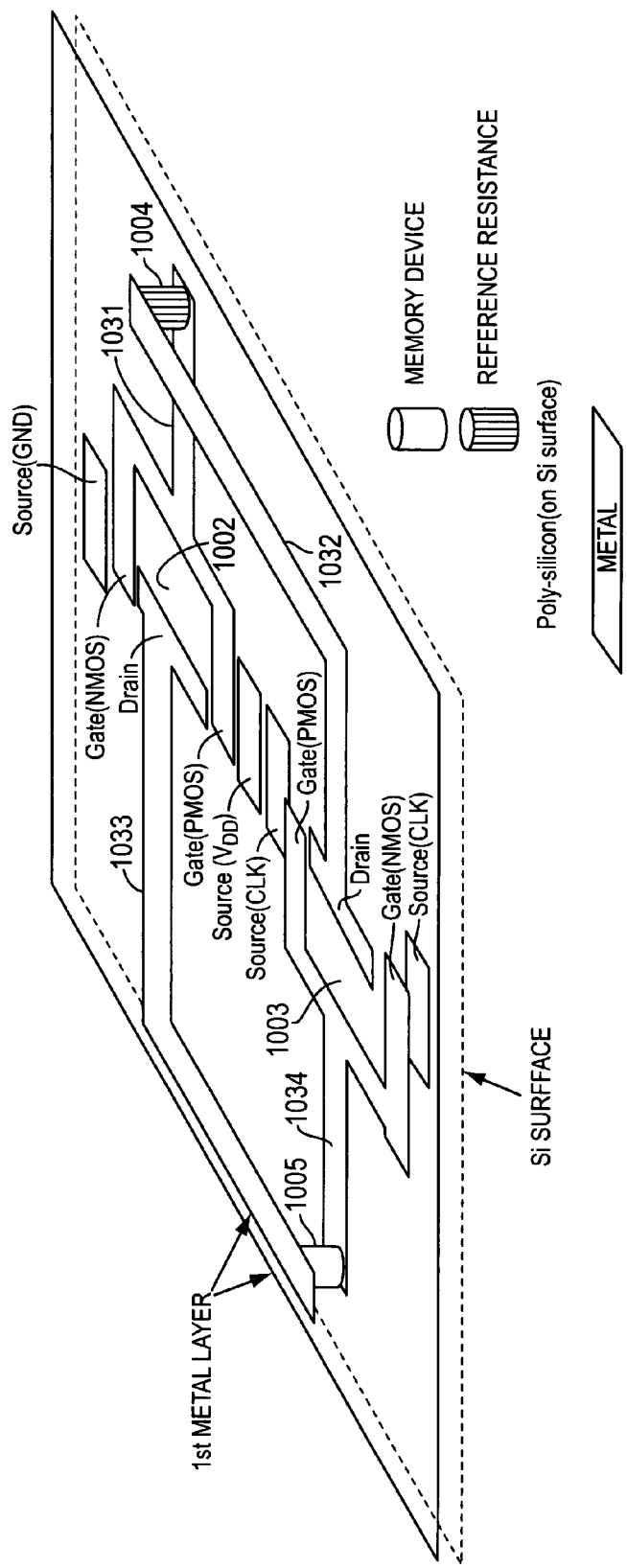
FIGS. 10J, 10K, 10L, 10M, 10N, and 10O illustrate process steps and three-dimensional structures corresponding to the slave circuit illustrated in FIGS. 10A through 10I.
Figure 10K:
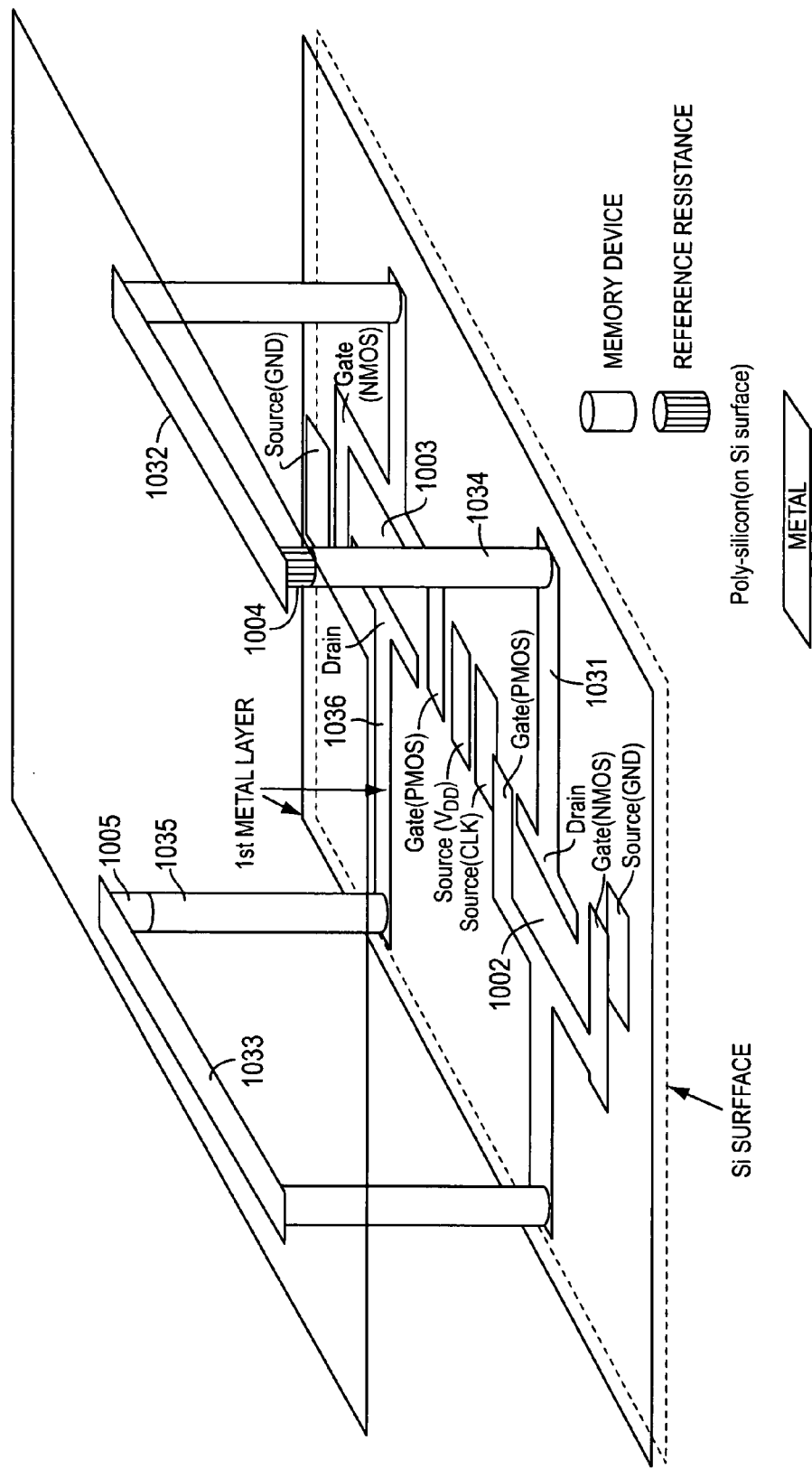
Figure 10L:
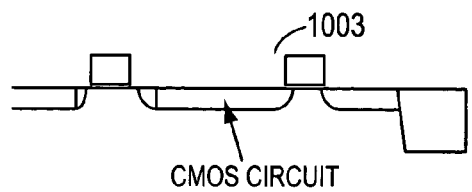
Figure 10M:
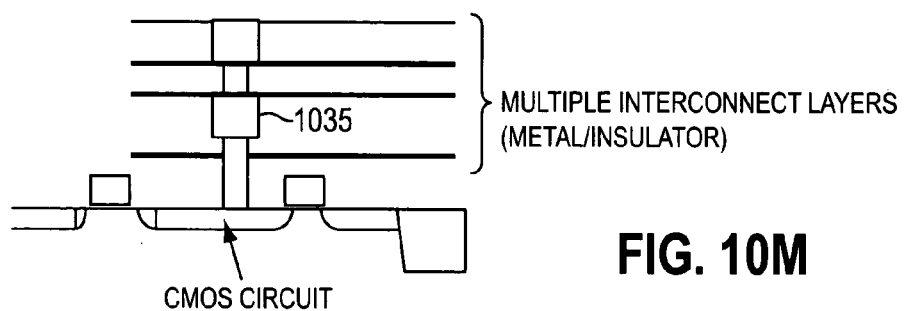
Figure 10N:
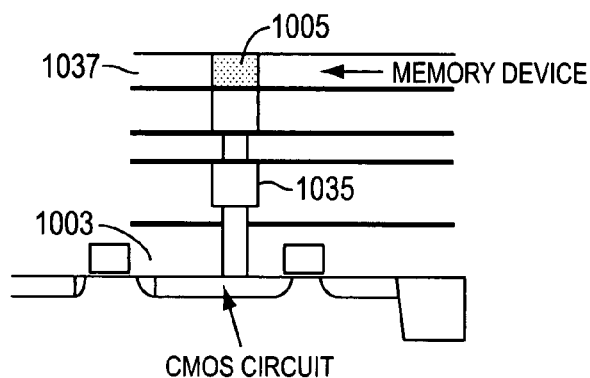
Figure 10O:
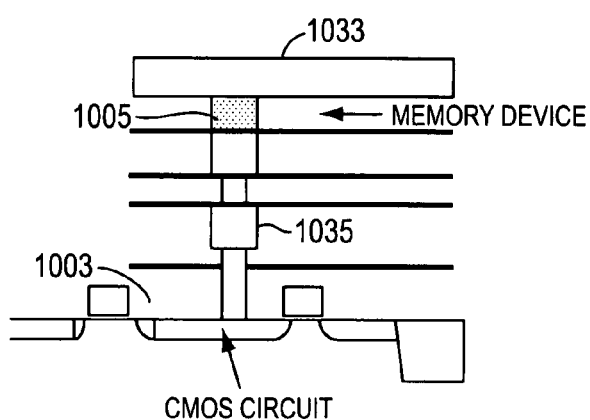

FIGS. 10A through 10O illustrate an embodiment of a slave circuit 1000 of a D flip-flop according to the present invention. As shown in FIG. 10A, slave circuit 1000 (which can replace slave circuit 910 in FIG. 9A) includes an inverter 1002 cross-coupled with an inverter/transmitter circuit 1003. A fixed reference resistor 1004 is coupled between an output terminal of inverter 1002 and an input terminal of inverter/transmitter circuit 1003. Further, a memory 1005 is coupled between an output terminal of inverter/transmitter circuit 1003 and an input terminal of inverter 1002. The input terminal of inverter 1002 is coupled to a transmission gate 1001 that is open on a low clock cycle and closed on a high clock cycle, as was discussed with FIG. 9A. The output terminal of inverter 1002 provides the output signal Q. As will be discussed below, a transmission gate such as transmission gate 810 shown in FIG. 9A is not needed in the embodiment shown in FIG. 10A.

FIG. 10B shows an embodiment of the inverter/transmitter circuit 1003. In some embodiments, inverter/transmitter circuit 1003 is a CMOS inverter with a series coupled PMOS transistor 1010 and NMOS transistor 1011. The source contact of PMOS transistor 1010 is coupled to the inverted clock signal ($\overline{CK}$) and the source contact of NMOS transistor 1011 is coupled to the clock signal CK. As illustrated in FIG. 10C, when the clock signal CK is low, inverter/transmitter 1003 acts as a conventional inverter (i.e., a low input signal results in a high output signal and a high input signal results in a low output signal). However, as is illustrated in FIG. 10D, when the clock signal CK is high, inverter/transmitter 1003 acts as a transmitter whereby an input signal close to high results in a high output signal and an input signal close to low results in a low output signal.

Inverter/transmitter circuit 1003 can be any circuit that acts as an inverter on a low clock signal and a transmitter on a high clock signal. One embodiment of inverter/transmitter circuit 1003 is illustrated in FIGS. 10B, 10C, and 10D. Some other embodiments of inverter/transmitter circuit 1003 are shown in FIGS. 10E and 10F.

The embodiment of inverter/transmitter circuit 1003 shown in FIG. 10E includes a fixed resistor 1021 coupled serially with a N-MOS transistor 1020 between the clock signal and the inverse clock signal. In some embodiments the resistance of resistor 1021 can be substantially greater than the resistance of transistor 1020 when transistor 1020 is on (e.g., 10 times or more). An input signal can be applied to the gate of transistor 1020 and the output signal is at a node 1024 between resistor 1021 and transistor 1020. When the clock signal is low, a high signal applied to the gate of transistor 1020 results in substantially a low signal at node 1024. The voltage level of the signal at node 1024 is determined by the comparative resistances of resistor 1021 and transistor 1020. A low signal applied to the gate of transistor 1020 when the clock signal is low results in a high signal at node 1024. When the clock signal is high, a high signal applied to the gate of transistor 1020 results in a high signal at node 1024. Also, when the clock signal is high, a low signal applied to the gate of transistor 1020 results in a low signal at node 1024. Therefore, the embodiment of inverter/transmitter 1003 shown in FIG. 10E operates as an inverter when the clock signal is low and as a follower when the clock signal is high.

Similarly, the embodiment of inverter/transmitter circuit 1003 shown in FIG. 10F includes a fixed resistor 1023 coupled serially with a P-MOS transistor 1022 between the clock signal and the inverse clock signal. In some embodiments, the resistance of resistor 1023 can be substantially greater than the resistance of transistor 1022 when transistor 1022 is on (e.g., 10 times or more). An input signal can be applied to the gate of transistor 1022 while an output signal is provided at a node 1025 between transistor 1022 and resistor 1023. When the clock signal is low, a high signal applied to the gate of transistor 1022 results in a low signal at node 1025 and a low signal applied to the gate of transistor 1022 results in a high signal at node 1025. When the clock signal is high, a high signal applied to the gate of transistor 1022 results in a high signal at node 1025 and a low signal applied to the gate of transistor 1022 results in a low signal at node 1025. Therefore, the embodiment of inverter/transmitter 1003 shown in FIG. 10F also operates as an inverter when the clock signal is low and a transmitter when the clock signal is high.

FIG. 10G illustrates slave circuit 1000 when clock signal CK is high. In that case, inverter/transmitter 1003 acts as a transmitter and holds whatever voltage is at its input, the voltage Q. Further, transmission gate 1001 is closed so that input data is clocked into slave 1000. The input data is inverted by inverter 1002 and therefore inverter/transmitter 1003 holds the inverse of the input data. Therefore, the voltage across memory 1005 is the voltage Vdd in a direction dictated by the data (i.e., if the input data is high then the input voltage is Vdd and inverter/transmitter 1003 holds a zero voltage and if the input data is low then the input voltage is zero volts and inverter/transmitter 1003 holds Vdd). In some embodiments, the polarity of memory 1005 is such that a low resistance state is arranged upon a high input data state and a high resistance state is arranged upon a low input data state.

FIG. 10H illustrates slave 1000 when the clock signal CK is in a low state. In that case, transmission gate 1001 is open. Inverter/transmitter 1003 acts as an inverter. Further, input data has been written into cross-coupled inverters 1002 and 1003 and memory 1005 during the high clock cycle. Therefore, as previously discussed, the data is held in the cross-coupled inverters 1002 and 1003.

FIG. 10I illustrates the situation when voltage is turned off to slave 1000. In that case, both the output signals from inverter/transmitter 1003 and inverter 1002 are zero. Data is lost, therefore, from the cross-coupled inverters 1002 and 1003. However, the resistive state of memory 1005 remains. Therefore, data is stored in the high or low resistive state of memory 1005. When voltage returns to slave 1000 and the clock signal becomes low, the data stored in memory 1005 is read and returned to the cross-coupled inverters 1002 and 1003. For example, the output signal from inverter 1002 will become low and the output signal from inverter/transmitter 1003 becomes high if the resistance of memory 1005 is low (i.e., lower than the resistance of reference resistor 1004). Conversely, if the resistance of memory 1005 is high then the output signal from inverter 1002 becomes high and the output signal from inverter/transmitter 1003 becomes low.

Therefore, by utilizing inverter/transmitter 1003 shown in FIG. 10A to replace inverter 806 and transmission gate 810, a nonvolatile D flip-flop is formed without need of a transmission gate or additional transistors.

FIG. 10J illustrates an example of a three-dimensional stereograph of slave circuit 1000 shown in FIG. 10A. As shown in FIG. 10J, reference resistor 1004 can be formed between a polysilicon layer 1031 and a metallization layer 1032. Additionally, memory 1005 can be formed between a polysilicon layer 1034 and a metallization layer 1033. In that fashion, resistor 1004 and memory 1005 are formed in the conducting lines that couple inverter 1002 and inverter/transmitter 1003. As shown in FIG. 10J, inverter 1002 and inverter/transmitter 1003 can be formed of CMOS type transistors in silicon and coupled through conducting paths to form latch 1000. The process for forming resistor 1004 and memory 1005 between a polysilicon layer and a metallization layer was described above with respect to FIGS. 5D through 5H.

FIG. 10K illustrates another example of a three-dimensional stereograph of slave circuit 1000 shown in FIG. 10A. The example shown in FIG. 10K, however, includes other structure (not shown) so that reference resistor 1004 and memory 1005 are formed towards the top of the device. Resistor 1004 is formed as part of a conducting post 1034 that couples metallization 1032 with polysilicon 1031. Additionally, memory 1005 is formed on a conducting post 1035 that couples metallization 1033 with polysilicon 1036.

FIGS. 10L through 10O illustrate the process of producing the three-dimensional stacked memory device shown in FIG. 10K. As shown in FIG. 10L, the CMOS transistors corresponding to inverter 1003 are fabricated in a conventional Si process on a Si substrate. Further, as shown in FIG.

10M, multiple interconnects are fabricated by a conventional LSI process to form conducting post 1035. As shown in FIG. 10N, a top insulating layer 1037 is deposited and then etched to form an access hole to post 1035. Memory 1005 is then constructed on post 1035. As previously discussed, memory 1005 may be etched even with insulating layer 1037. As shown in FIG. 10O, metallization layer 1033 is formed over memory 1005 and insulating layer 1037. As will now be recognized by those skilled in the art, each layer shown in FIGS. 10L through 10O can be formed by conventional deposition, lithography, and etching processes.

FIGS. 11A, 11B, 11C, 11D, and 11E illustrate an embodiment of an RS latch 1100 that can be utilized in a flip-flop according to the present invention. RS latch 1100 includes cross-coupled NAND gate 1101 and NAND gate/transmitter 1102. A reference resistor 1104 is coupled between an output terminal of NAND gate 1101 and an input terminal of NAND gate/transmitter 1102. A memory 1103 is coupled between an output terminal of NAND gate/transmitter 1102 and an input terminal of NAND gate 1101. A second input terminal of NAND gate 1101 receives a set (S) signal while a second input terminal of NAND gate/transmitter 1102 receives a reset (R) signal. The output signal Q is provided on the output terminal from NAND gate 1101 while the output signal $\overline{Q}$ is received provided on output terminal of NAND gate/transmitter 1102. Further, a transistor 1105 is coupled between the two input terminals of NAND gate 1101. The gate of transistor 1105 is coupled to receive the clock signal CK.

RS latch 1100 is similar to RS latch 500 shown in FIG. 5A except for replacement of memory 504 with reference resistor 1104, replacement of NAND gate 502 with NAND gate/transmitter 1102, and addition of transistor 1105.

An embodiment of NAND gate/transmitter 1102 is illustrated in FIG. 11B. As shown in FIG. 11B, the sources of p-MOS transistors 1110 and 1111 are coupled to the inverse clock signal $\overline{CK}$ and the source of a n-MOS transistor 1113 is coupled to the clock signal CK. When the clock signal is low, NAND gate/transmitter 1102 operates as a normal NAND gate. However, when the clock signal is high, NAND gate/transmitter 1102 operates as an AND gate. FIG. 11C illustrates the truth table for NAND gate/transmitter 1102 shown in FIG. 11B for both low and high clock signals.

Therefore, when the clock signal is low, RS latch 1100 operates similarly to that described for RS latch 500 of FIGS. 5A and 6A for a low clock signal. When the clock signal is high, however, RS latch 1100 operates differently. Valid inputs are S=0, R=1 and R=1, S=0.

Figure 11D:
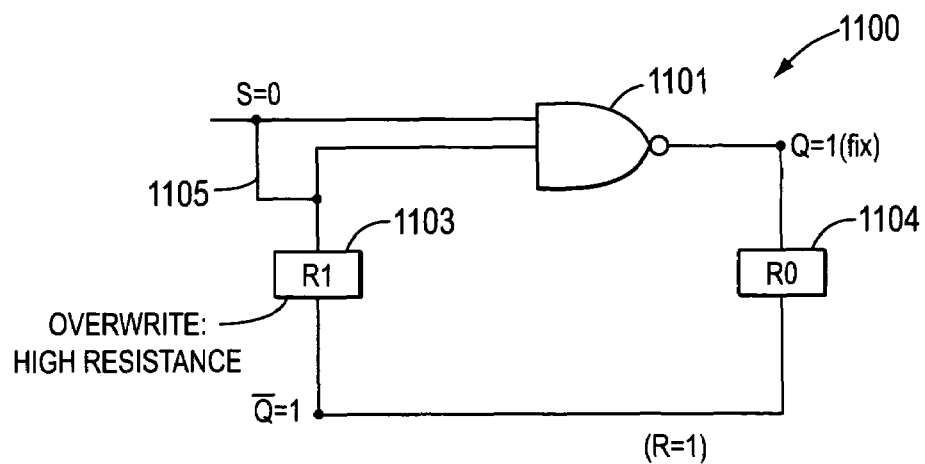

FIG. 11D illustrates RS latch 1100 when the clock is high, S=0, and R=1. Since S=0, Q is 1. With R=1, NAND gate/transmitter 1102 holds $\overline{Q}$ to be 1 as well, as shown in the chart of FIG. 11C. Therefore, a current flows from the Vdd level of $\overline{Q}$ to the zero voltage of the input terminal of NAND gate 110 through memory 1103. In some embodiments, then, the resistance of memory 1103 becomes high.

Figure 11E:
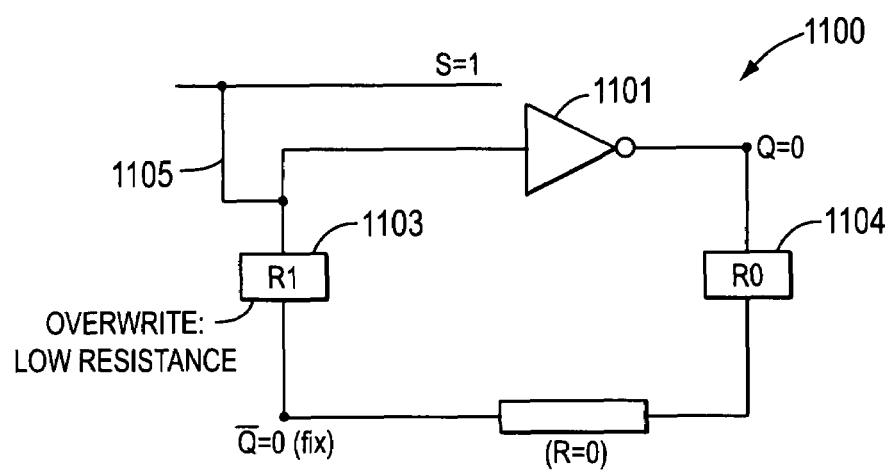

FIG. 11E illustrates RS latch 1100 when the clock is high, S=1, and R=0. In that case, the output terminal of NAND gate 1101, Q, becomes low. When R is low and Q is low, NAND gate/transmitter 1102 holds $\overline{Q}$ to be low as well. Therefore, in this case, the current flows through memory 1103 from the S terminal at Vdd to $\overline{Q}$ at zero volts, setting a low resistance state in memory 1103 in some embodiments. The polarity of the resistance set when S=1 and R=0, then, is opposite the polarity of resistance set when S=0 and R=1.

Therefore, by using NAND gate/transmitter 1102 in RS latch 1100, a non-volatile RS latch that can be utilized in a D flip-flop can be formed with addition of only a single transistor, i.e., transistor 1105.

In the embodiments discussed above, the illustrated memories (e.g., memories 503 and 504 of FIG. 5A, memories 901 and 902 of FIG. 9A, memory 1005 of FIG. 10A, or memory 1103 of FIG. 11A) change resistive state upon passage of sufficient current (i.e., application of a voltage across the memory) through the memory. The memory changes between a low resistance state and a high resistance state depending on the polarity of the current flowing through the memory. These memories can be, for example, spin injection magnetic tunnel junction memory. However, in other magnetic tunnel junction (MTJ) memories, the state of the memory is changed by application of a magnetic field to the memory. The magnetic field can be generated through application of a current in close proximity to the memory.

Figure 12A:
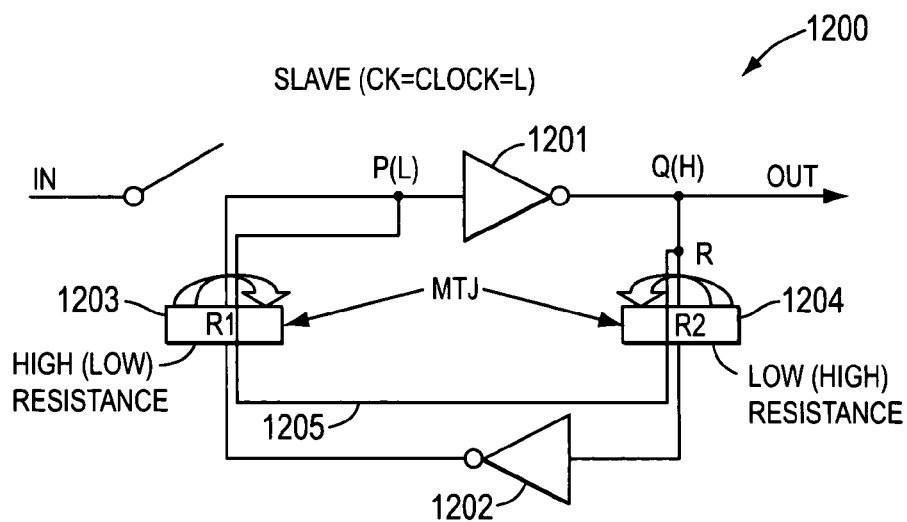
FIGS. 12A, 12B, and 12C illustrate another embodiment of a slave circuit according to some embodiments of the present invention.
Figure 12B:
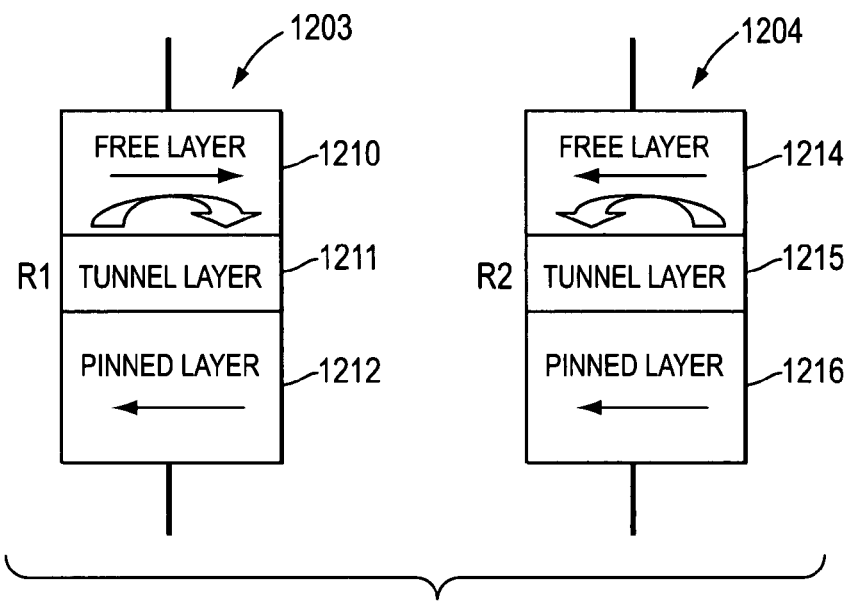
Figure 12C:
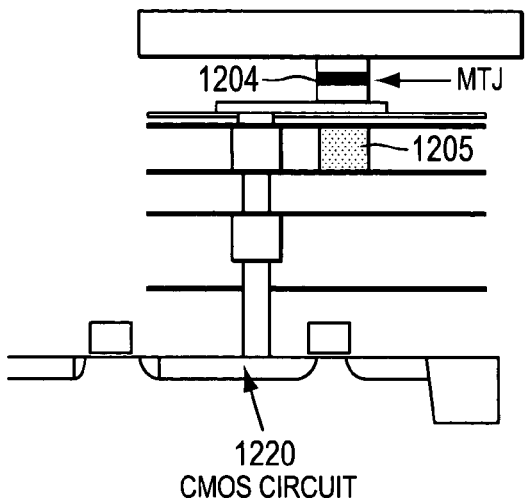

FIGS. 12A through 12C illustrate a slave 1200 according to another embodiment of the present invention. Slave 1200 includes cross-coupled inverters 1201 and 1202 with a memory 1204 coupled between an output terminal of inverter 1201 and an input terminal of inverter 1202. Further, a memory 1203 is coupled between the output terminal of inverter 1202 and an input terminal of inverter 1201. Additionally, a separate line 1205 is coupled between the input terminal and output terminal of inverter 1201, in order to apply opposite magnetic fields to memory 1203 and memory 1204 The magnetic field applied to memories 1203 and 1204 is induced by the current flow through line 1205, which changes spin direction of free layer 1210 and 1212, depending on the data stored between inverters 1201 and 1202. Therefore, the resistive state of memory 1203 is opposite that of memory 1204.

FIG. 12B illustrates the structures of memories 1203 and 1204. Memory 1203, for example, includes a half-metal layer 1210, a tunneling layer 1211, and a single crystal layer 1212 that is magnetically pinned. Similarly, memory 1204 includes a half-metal layer 1214, a tunneling layer 1215, and a crystal layer 1216 that is magnetically pinned. In some embodiments, the on/off resistance ratio can be over 100%. Further, the resistance is set by whether the magnetic field in layer 1210 is aligned or not aligned with the magnetic field in layer 1212.

FIG. 12C illustrates a structure containing a memory 1204 as shown in FIG. 12A, for example. As shown in FIG. 12C, memory 1204 can be formed within a 3-D circuit structure. A CMOS circuit 1220 can be formed on a substrate. Memory 1204 can be formed above CMOS circuit 1220, embedded in the multiple interconnects of CMOS circuit 1220. Separate line 1205, which provides the magnetic field to set the resistive state of memory 1204, can then be formed as an interconnect.

Figure 13A:
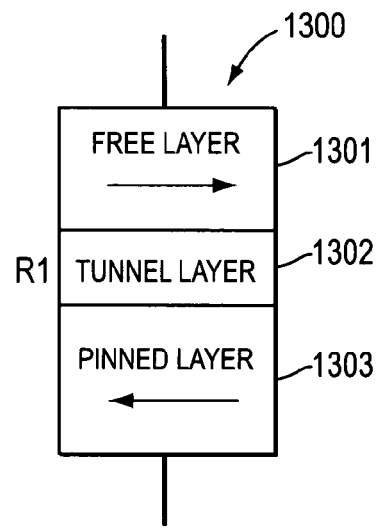
FIG. 13A illustrates a spin-injection magnetic tunnel junction memory that can be utilized in embodiments of the present invention.

FIG. 13A illustrates a spin-injection magnetic tunnel junction memory 1300 that can be utilized, for example, as memories 503 and 504 of FIG. 5A, memories 901 and 902 of FIG. 9A, memory 1005 of FIG. 10A, or memory 1103 of FIG. 11A. The resistive state of memory 1300 changes with current flowing through memory 1300 and does not require a separate magnetic field, as did memory 1203 or 1204 illustrated in FIGS. 12A through 12C. A write or erase operation on memory 1300, then, can be performed by applying a voltage across memory 1300. Memory 1300 includes a tunnel layer 1302 sandwiched between a free layer 1301 and a pinned layer 1303. Such a memory system is described in Liu et al., Appl. Phys. Lett. 82, 2871 (2003). As described in Liu et al., the ON/OFF resistance ratio of memory 1300 can be as low as 20%. However, if half-metallic ferromagnetic layers with high spin polarization ratios are utilized for pinned layer 1303 and free layer 1301, and tunnel layer 1302 is an ultra thin layer of, for example, $Al_2O_3$, the ON/OFF resistance ratio may become as high as 200%. Such an ON/OFF resistance ratio is easily applicable to embodiments of the present invention.

Figure 13B:
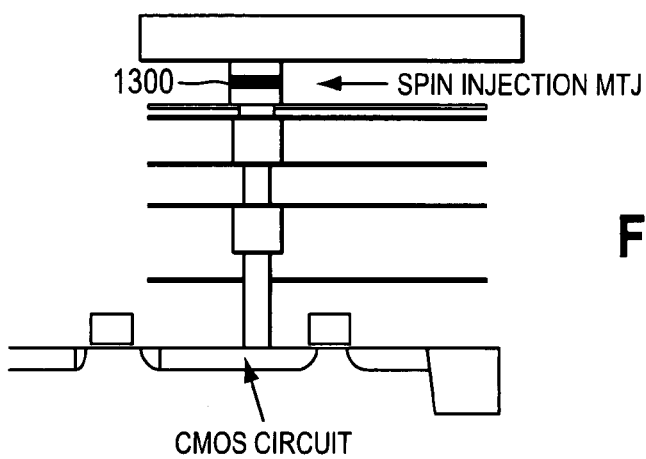
FIG. 13B shows a cross section of an integrated circuit that incorporates a spin-injection magnetic tunnel junction memory.

FIG. 13B illustrates production of memory 1300 in a three-dimensional circuit structure. Memory 1300, as shown in FIG. 13B, can be formed in the interconnects of a CMOS circuit structure. Production of a three-dimensional circuit structure that can utilize memory 1300 is illustrated, for example, in FIGS. 10L through 10O.

Figure 14A:
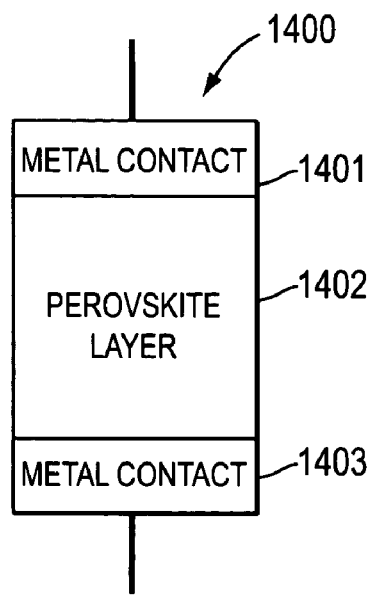
FIG. 14A illustrates a metal insulator phase change memory that can be utilized in embodiments of the present invention.

FIG. 14A illustrates a memory 1400 that can be utilized in embodiments of the present invention. Memory 1400 is a metal insulator phase change memory. As shown in FIG. 14A, memory 1400 includes a perovskite layer 1402 sandwiched between two metallic layers 1401 and 1403 to serve as metal contacts. Certain doped perovskites exhibit a charge-induced insulator-to-metal transition. Cr-doped $SrZrO_3$ and Cr-doped $SrTiO_3$ (STO), for example, each exhibits a resistive change when current is passed through memory 1400. Cr-doped STO, for example, exhibits a dc-current induced reversible insulator to conductor transition with resistance change of five orders of magnitude, as shown in Watanabe et al., Appl. Phys. Lett. 78, 3738 (2001).

Figure 14B:
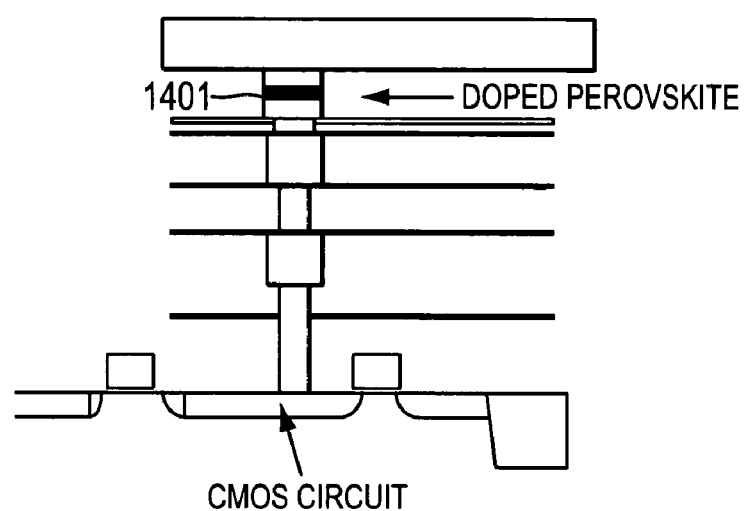
FIG. 14B illustrates a cross section of an integrated circuit that incorporates a metal insulator phase change memory.

FIG. 14B illustrates formation of memory 1401 in a CMOS circuit structure. As shown in FIG. 14B, memory 1401 is incorporated into the interconnect layers of a three-dimensional circuit structure. Deposition of perovskite materials can be accomplished, for example, by a chemical vapor deposition process. Production of a three-dimensional circuit structure that can utilize memory 1401 is illustrated, for example, in FIGS. 10L through 10O.

Figure 15:
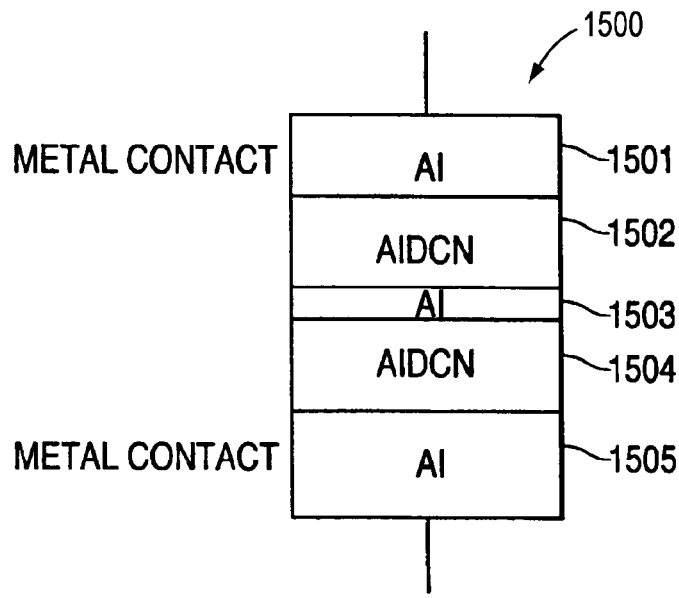
FIG. 15 illustrates an organic memory that can be utilized in embodiments of the present invention.

FIG. 15 illustrates another memory 1500 that can be utilized in embodiments of the present invention. Memory 1500 includes organic AlDCN layers 1502 and 1504 separated by a thin Al layer 1503 and sandwiched by Al contact layers 1501 and 1505. As reported by Ma et al., Appl. Phys. Lett. 80, 2997 (2002), memory 1500 can exhibit a reversible resistance change with ON/OFF ratio over five orders in magnitude. Such a structure may be formed on multiple interconnects in a CMOS circuit because of weak thermal tolerance at temperatures for multiple interconnect processes.

Figure 16:
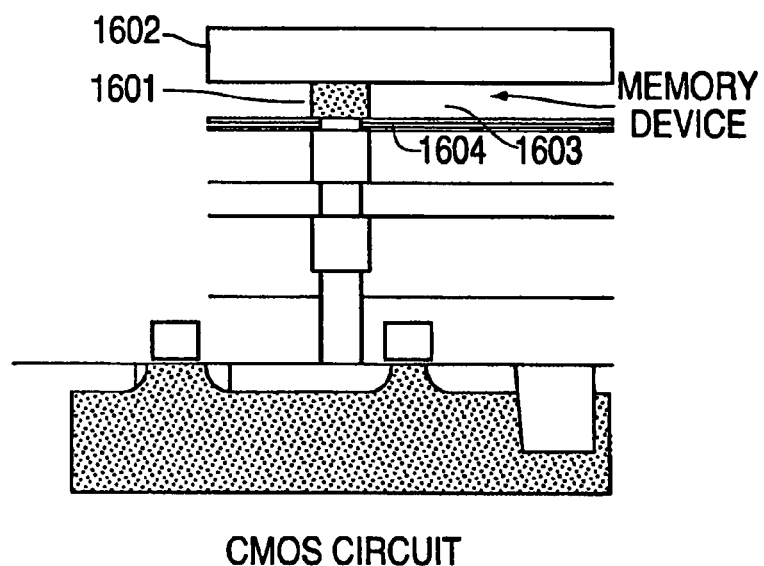
FIG. 16 illustrates a cross section of a CMOS circuit structure that includes a memory that can be utilized in embodiments of the present invention.

FIG. 16 illustrates a cross section of a CMOS circuit structure that includes a memory 1601 that can be utilized in embodiments of the present invention. Memory 1601 is formed on a polysilicon layer 1604. An insulating layer 1603 is deposited on polysilicon layer 1604, patterned, and etched. Memory 1601 is then formed on polysilicon layer 1604 in insulating layer 1603. Etching and deposition of memory device 1601 can utilize standard processing techniques. A metallic layer 1602 can then be deposited over insulating layer 1603 and memory 1601.

In the case where memory 1601 includes materials with weak thermal tolerances at temperatures required for the formation process of multi-interconnect layers or contamination to CMOS, it may be difficult to form memory 1601 between polysilicon layer 1604, which is connected to a gate, and metallic layer 1602, which may be a M1 layer. In that case, memory 1601 can be formed on a top layer of interconnects instead of on the multi-interconnected layers shown in FIG. 16. Production of a three-dimensional circuit structure that can utilize memory 1601 is illustrated, for example, in FIGS. 10L through 10O.

Therefore, embodiments of the sequential circuit, which can include a nonvolatile RS latch, nonvolatile slave circuit, or other nonvolatile memory circuit according to the present invention, can recover from being powered down. The power down feature can save significant amounts of power in logic circuits. Data is stored in resistive state nonvolatile memories during the power down and the state of the memory circuit is restored when power returns to the circuit.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory circuit, comprising:
 a volatile data storage circuit; and
 at least one nonvolatile memory coupled within the volatile data storage circuit,
 wherein the at least one nonvolatile memory includes a high resistive state and a low resistive state,
 wherein the at least one nonvolatile memory is stacked between metallization layers of the volatile data storage circuit.

2. A memory circuit, comprising:
 a volatile data storage circuit; and
 at least one nonvolatile memory coupled within the volatile data storage circuit,
 wherein the at least one nonvolatile memory includes a high resistive state and a low resistive state,
 wherein the at least one nonvolatile memory is stacked on top of metallization layers of the volatile data storage circuit.

3. The memory circuit of claims 1 or 2, wherein the memory circuit is coupled to one or more logic circuits.

4. The memory circuit of claims 1 or 2, wherein the volatile data storage circuit includes cross-coupled inverters.

5. The memory circuit of claim 4, wherein the cross-coupled inverters are serially coupled to the at least one nonvolatile memory.

6. The memory circuit of claims 1 or 2, wherein the volatile data storage circuit includes cross-coupled NAND gates.

7. The memory circuit of claim 6, wherein the cross-coupled NAND gates are coupled serially with the at least one nonvolatile memory.

8. A memory circuit, comprising:
 a volatile data storage circuit; and
 at least one nonvolatile memory coupled within the volatile data storage circuit,
 wherein the at least one nonvolatile memory includes a high resistive state and a low resistive state,
 wherein the volatile data storage circuit includes an inverter cross-coupled with an inverter/transmitter.

9. The memory circuit of claim 8, wherein the inverter/transmitter includes serially coupled p-type MOSFET and n-type MOSFET, a source of the p-type MOSFET being coupled to receive an inverted clock signal and a source of the n-type MOSFET being coupled to receive the clock signal.

10. The memory circuit of claim 8, wherein the inverter/transmitter includes a resistor serially coupled with an N-MOS transistor between a clock signal and an inverse to the clock signal.

11. The memory circuit of claim 8, wherein the inverter/transmitter includes a resistor serially coupled with a P-MOS transistor between terminals for receiving a clock signal and an inverse to the clock signal.

12. A memory circuit, comprising:
 a volatile data storage circuit; and at least one nonvolatile memory coupled within the volatile data storage circuit, wherein the at least one nonvolatile memory includes a high resistive state and a low resistive state, wherein the volatile data storage circuit includes a NAND gate cross-coupled with a NAND gate/inverter.

13. The memory circuit of claim 12, wherein the NAND gate/inverter includes p-type MOSFETs coupled to receive an inverted clock signal of a logic circuit and n-type MOSFETs coupled to receive the clock signal.

14. A memory circuit, comprising:
a volatile data storage circuit; and
at least one nonvolatile memory coupled within the volatile data storage circuit,
wherein the at least one nonvolatile memory includes a high resistive state and a low resistive state,
wherein the at least one nonvolatile memory includes a spin-injection magnetic tunnel junction memory.

15. A memory circuit, comprising:
a volatile data storage circuit; and
at least one nonvolatile memory coupled within the volatile data storage circuit,
wherein the at least one nonvolatile memory includes a high resistive state and a low resistive state,
wherein the at least one nonvolatile memory includes a magnetic tunnel junction memory.

16. A memory circuit, comprising:
a volatile data storage circuit; and
at least one nonvolatile memory coupled within the volatile data storage circuit,
wherein the at least one nonvolatile memory includes a high resistive state and a low resistive state,
wherein the at least one nonvolatile memory includes a metal insulator phase change memory.

17. A memory circuit, comprising:
a volatile data storage circuit; and
at least one nonvolatile memory coupled within the volatile data storage circuit,
wherein the at least one nonvolatile memory includes a high resistive state and a low resistive state,
wherein the at least one nonvolatile memory includes an organic memory.

18. A nonvolatile latch, comprising:
a volatile data storage circuit; and
at least one nonvolatile memory coupled within the volatile data storage circuit,
wherein the at least one nonvolatile memory includes a high resistive state and a low resistive state,
wherein the latch can receive a set signal and a reset signal and wherein data stored in the volatile data storage circuit is written into the at least one nonvolatile memory when the set signal is not equal to the reset signal.

19. The latch of claim 18, wherein data is read from the nonvolatile memory into the volatile data storage circuit when the set signal and the reset signal are both high.

20. A nonvolatile latch, comprising:
a volatile data storage circuit; and
at least one nonvolatile memory coupled within the volatile data storage circuit,
wherein the at least one nonvolatile memory includes a high resistive state and a low resistive state,
wherein the volatile data storage circuit comprises:
a first NAND gate coupled to receive a set signal at a first input terminal of the first NAND gate; and
a second NAND gate coupled to receive a reset signal at a first input terminal of the second NAND gate;

wherein an output terminal of the first NAND gate is coupled to a second input terminal of the second NAND gate and an output terminal of the second NAND gate is coupled to a second input terminal of the first NAND gate.

21. The latch of claim 20, wherein the at least one nonvolatile memory comprises:
a first resistive component coupled between the output terminal of the first NAND gate and the second input terminal of the second NAND gate; and
a second resistive component coupled between the output terminal of the second NAND gate and the second input terminal of the first NAND gate,
wherein at least one of the first resistive component and the second resistive component is a resistive memory.

22. The latch of claim 21, wherein each of the first resistive component and the second resistive component is a resistive memory.

23. The latch of claim 21, wherein the resistive memory includes a spin-injection magnetic tunnel junction memory.

24. The latch of claim 21, wherein the resistive memory includes a magnetic tunnel junction memory.

25. The latch of claim 21, wherein the resistive memory includes a metal insulator phase change memory.

26. The latch of claim 21, wherein the memory includes an organic memory.

27. The latch of claim 21, further including:
a first transistor coupled between the first resistive component and the second input terminal of the second NAND gate;
a second transistor coupled to a terminal of the first resistive component opposite the first NAND gate and to receive an intermediate voltage;
a third transistor coupled between the second resistive component and the second input terminal of the first NAND gate;
a fourth transistor coupled to a terminal of the second resistive component opposite the second NAND gate and to receive the intermediate voltage; and
an exclusive OR gate coupled to receive the set signal and the reset signal, an output of the exclusive OR gate being coupled to a gate of the second transistor and a gate of the fourth transistor, an inverse output of the exclusive OR gate being coupled to a gate of the first transistor and a gate of the third transistor.

28. The latch of claim 21, wherein when the set signal and the reset signal are opposite, the intermediate voltage is placed across the first resistive component and the second resistive component in complementary fashion.

29. The latch of claim 28, wherein the intermediate voltage is half the power supply voltage.

30. A nonvolatile latch, comprising:
a volatile data storage circuit; and
at least one nonvolatile memory coupled within the volatile data storage circuit,
wherein the at least one nonvolatile memory includes a high resistive state and a low resistive state,
wherein the volatile data storage circuit comprises:
a first inverter with an input terminal and an output terminal, the input terminal of the first inverter being coupled to receive an input signal;
a second inverter with an input terminal coupled to the output terminal of the first inverter and an output terminal coupled to the input terminal of the first inverter; and a clock-driven gate coupled between the output terminal of the second inverter and the input terminal of the first inverter.

31. The latch of claim 30, wherein the at least one nonvolatile memory comprises:
   a first resistive element coupled between the input terminal of the first inverter and the clock-driven gate; and
   a second resistive element coupled between the output terminal of the first inverter and the input terminal of the second inverter,
   wherein at least one of the first resistive element and the second resistive element is a memory.

32. The latch of claim 31, further including a first transistor coupled to the first resistive element and to receive an intermediate voltage, a second transistor coupled to the second resistive element and to receive the intermediate voltage, and wherein a gate of the first transistor and a gate of the second transistor are coupled to a clock.

33. A nonvolatile latch, comprising:
   a volatile data storage circuit; and
   at least one nonvolatile memory coupled within the volatile data storage circuit,
   wherein the at least one nonvolatile memory includes a high resistive state and a low resistive state,
   wherein the volatile data storage circuit comprises:
   an inverter having an input terminal and an output terminal, the input terminal capable of receiving an input signal; and
   an inverter/transmitter circuit having an input terminal and an output terminal, the input terminal of the inverter/transmitter circuit coupled to the output terminal of the inverter and the output terminal of the inverter/transmitter circuit coupled to the input terminal of the inverter.

34. The latch of claim 33, wherein the at least one nonvolatile memory includes:
   a first resistive element coupled between the input terminal of the inverter and the output terminal of the inverter/transmitter circuit; and
   a second resistive element coupled between the output terminal of the inverter and the input terminal of the inverter/transmitter circuit,
   wherein at least one of the first resistive element and the second resistive element is a resistive memory.

35. The latch of claim 34, wherein the inverter/transmitter circuit includes serially coupled p-type MOSFET and n-type MOSFET, a source of the p-type MOSFET being coupled to receive an inverted clock signal and a source of the n-type MOSFET being coupled to receive the clock signal.

36. The latch of claim 34, wherein the inverter/transmitter circuit includes a resistor serially coupled with an N-MOS transistor between terminals for receiving a clock signal and an inverse to the clock signal.

37. The latch of claim 34, wherein the inverter/transmitter circuit includes a resistor serially coupled with a P-MOS transistor between a clock signal and an inverse to the clock signal.

38. A nonvolatile latch, comprising:
   a volatile data storage circuit; and
   at least one nonvolatile memory coupled within the volatile data storage circuit,
   wherein the at least one nonvolatile memory includes a high resistive state and a low resistive state,
   wherein the volatile data storage circuit comprises:
   a NAND gate coupled to receive a set signal and having an input terminal and an output terminal; and
   a NAND gate/transmitter coupled to receive a reset signal and having an input terminal coupled to the output terminal of the NAND gate and an output terminal coupled to the input terminal of the NAND gate.

39. The latch of claim 38, wherein the at least one nonvolatile memory includes:
   a first resistive element coupled between the input terminal of the NAND gate and the output terminal of the NAND gate/transmitter; and
   a second resistive element coupled between the output terminal of the NAND gate and the input terminal of the NAND gate/transmitter,
   wherein at least one of the first resistive element and the second resistive element is a resistive memory.

40. The latch of claim 39, wherein the NAND gate/transmitter includes p-type MOSFETs coupled to receive an inverted clock signal of a logic circuit and n-type MOSFETs coupled to receive the clock signal.

41. A method of retaining data on power down, comprising:
   storing data in a volatile data storage circuit that stores data;
   writing the data as one of a plurality of resistance states of a nonvolatile memory; and
   reading the data stored in the nonvolatile memory to restore data in the volatile data storage circuit,
   wherein the volatile data storage circuit is an RS latch and data is stored when a set signal and a reset signal are complementary.

42. The method of claim 41, wherein reading the data stored in the nonvolatile memory includes supplying a high set signal and a high reset signal.

43. A method of retaining data on power down, comprising:
   storing data in a volatile data storage circuit that stores data;
   writing the data as one of a plurality of resistance states of a nonvolatile memory; and
   reading the data stored in the nonvolatile memory to restore data in the volatile data storage circuit,
   wherein writing the data as one of a plurality of resistance states of the nonvolatile memory includes passing current through a resistive element of the nonvolatile memory to create a low resistance state or a high resistance state.

44. A method of retaining data on power down, comprising:
   storing data in a volatile data storage circuit that stores data;
   writing the data as one of a plurality of resistance states of a nonvolatile memory; and
   reading the data stored in the nonvolatile memory to restore data in the volatile data storage circuit,
   wherein storing data in the volatile data storage circuit includes supplying a high clock signal.

45. A method of retaining data on power down, comprising:
   storing data in a volatile data storage circuit that stores data;
   writing the data as one of a plurality of resistance states of a nonvolatile memory; and
   reading the data stored in the nonvolatile memory to restore data in the volatile data storage circuit,
   wherein writing the data as one of a plurality of resistance states of the nonvolatile memory includes passing current through a resistive element during a high clock signal.

46. A method of retaining data on power down, comprising:
    storing data in a volatile data storage circuit that stores data;
    writing the data as one of a plurality of resistance states of a nonvolatile memory; and
    reading the data stored in the nonvolatile memory to restore data in the volatile data storage circuit,
    wherein reading the data includes supplying a low clock signal.

* * * * *